United States Patent
Park et al.

(10) Patent No.: US 9,509,283 B2
(45) Date of Patent: Nov. 29, 2016

(54) INTERPOLATION FILTER BASED ON TIME ASSIGNMENT ALGORITHM

(71) Applicant: Electronics and Telecommunications Research Institute, Daejeon (KR)

(72) Inventors: Mi Jeong Park, Daejeon (KR); Jang Hong Choi, Daejeon (KR); Ik Soo Eo, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 373 days.

(21) Appl. No.: 14/120,351

(22) Filed: May 14, 2014

(65) Prior Publication Data

US 2015/0019607 A1    Jan. 15, 2015

(30) Foreign Application Priority Data

May 14, 2013    (KR) ........................ 10-2013-0054430

(51) Int. Cl.
   *G06F 17/10*    (2006.01)
   *H03H 17/06*    (2006.01)

(52) U.S. Cl.
   CPC .... *H03H 17/0657* (2013.01); *H03H 2218/085* (2013.01)

(58) Field of Classification Search
   CPC ................................................ H03H 17/0657
   USPC ........................................ 708/290, 313, 316
   See application file for complete search history.

(56) References Cited

U.S. PATENT DOCUMENTS

| | | | | |
|---|---|---|---|---|
| 4,777,612 A | * | 10/1988 | Tomimitsu | ......... H03H 17/0275 708/316 |
| 4,852,035 A | * | 7/1989 | Michener | ........... H03H 17/0223 708/313 |
| 6,487,573 B1 | | 11/2002 | Jiang et al. | |
| 2004/0036638 A1 | * | 2/2004 | Lipka | ................. H03M 7/3015 341/143 |
| 2007/0046507 A1 | | 3/2007 | Hirano | |
| 2012/0203812 A1 | | 8/2012 | Lee et al. | |

FOREIGN PATENT DOCUMENTS

| | | |
|---|---|---|
| KR | 10-0270165 A | 7/2000 |
| KR | 10-2004-0050401 A | 6/2004 |

OTHER PUBLICATIONS

Mitsuru Yamada et al., "High-Speed FIR Digital Filter with CSD Coefficients Implemented on FPGA", IEEE Design Automation Conference, Jan. 30, 2001, pp. 7-8, Yokohama, Japan.
Kyunghi Chang et al,. "Structures and Performance Analysts of Digital Nyquist FIR Filters in Indoor Environment", IEEE 4th International Symposium on Spread Spectrum Techniques and Applications Proceedings, Sep. 22-25, 1996, pp. 683-687, vol. 2, Mainz, Germany.

* cited by examiner

*Primary Examiner* — Tan V. Mai

(57) ABSTRACT

Disclosed is an interpolation filter based on time assignment algorithm. An interpolation filter comprises an enable signal generating part generating enable signals for operation of the interpolation filter, an input value generating part generating input values, a first calculating part generating a first output value based on a first enable signal and a first input value, a second calculating part generating a second output value based on a second enable signal and a second input value, and an output value selecting part selecting a final output value among the first output value and the second output value. Thus, continuity of output data can be guaranteed, and hardware can be shared by using time assignment algorithm so that a total size of the interpolation filter can be reduced.

15 Claims, 22 Drawing Sheets

FIG. 10

INTERPOLATION FILTER BASED ON TIME ASSIGNMENT ALGORITHM

CLAIM FOR PRIORITY

This application claims priorities to Korean Patent Application No. 10-2013-0054430 filed on May 14, 2013 in the Korean Intellectual Property Office (KIPO), the entire contents of which are hereby incorporated by references.

BACKGROUND

1. Technical Field

Example embodiments of the present invention relate to an interpolation filter, and more specifically to an interpolation filter based on time assignment algorithm which can process data having various input/output data rates.

2. Related Art

One of main blocks used in a mobile communication system is a filter. Especially, an interpolation filter is used for changing a sampling rate of outputs while maintaining a property of signal to be transmitted. The basic components for the interpolation filter include a delaying part, a multiplication and a summation part. Among the components, the multiplication part occupies the largest area in the interpolation filter. That is, the multiplication part is a main cause of increasing a cost of hardware for the interpolation filter.

In order to reduce cost of the hardware constituting the filter, it is an important issue to decrease the number of multipliers used for the multiplication part. Therefore, various interpolation filter structures (for example, a poly-phase transversal structure, a cascade structure, etc.) have been proposed in order to reduce the number of multipliers.

The poly-phase transversal structure is a structure in which a multiplier is shared by changing filter coefficients applied to the multiplier according to time proportionally to interpolation up-sampling ratio. If the poly-phase transversal structure is used, although there is an advantage of reducing the number of multipliers proportionally to a ratio of up-sampling, there may be a problem of increasing memory required for storing the filter coefficients due to the increased number of filter coefficients when the ratio of up-sampling is very large.

Meanwhile, the cascade structure is a structure in which multiple interpolation filters are used by dividing up-sampling ratio into small multiple up-sampling ratios. According to the cascade structure, there may be advantages in reducing the number of multipliers and filter coefficients. However, there is a problem that the number of multiplies which can be reduced is restricted according to the cascade structure.

SUMMARY

Accordingly, example embodiments of the present invention are provided to substantially obviate one or more problems due to limitations and disadvantages of the related art.

Example embodiments of the present invention provide an interpolation filter having a structure of shared multiplier based on time assignment algorithm.

In some example embodiments, an interpolation filter may comprise an enable signal generating part generating enable signals for operations of the interpolation filter based on a demanded sampling rate; an input value generating part generating input values from arbitrary data; a first calculating part generating a first output value having the demanded sampling rate based on a first enable signal among the enable signals and first input values among the input values; a second calculating part generating a second output value having the demanded sampling rate based on a second enable signal among the enable signals and second input values among the input values; and an output value selecting part selecting a final output value among the first output value and the second output value based on preconfigured selection criteria.

Here, the enable signal generating part may generate the enable signals by dividing a clock signal used in the interpolation filter by a predetermined value.

Here, the enable signal generating part may generate an enable signal for the input value generating part, an enable signal for the first calculating part, an enable signal for the second calculating part, and an enable signal for the output value selecting part by dividing the clock signal by 2 to $2^N$ (N is a positive integer).

Also, the input value generating part may generate the input values according to a rate of the arbitrary data based on time assignment algorithm.

Also, the first calculating part may generate the first output value for calculation periods corresponding to even-numbered coefficients of the interpolation filter among calculation periods.

Also, the first calculating part may further comprise a first delaying part delaying one of the first input values based on the first enable signal; a first muxing part selecting the delayed one of the first input values based on a configured output calculation period, and outputting the delayed one of the first input values; a first operating part generating a first output candidate value by generating first multiplication results for the outputs of the first muxing part and first coefficients of the interpolation filter and adding the first multiplication results; and a first selecting part selecting one of the first input values or the first output candidate value as the first output value based on an operation mode of the interpolation filter.

Here, the first delaying part may include a plurality of delaying blocks connected in a cascade structure, and each of the plurality of delaying blocks may delay one of the first input values and output the delayed one of the first input values based on a predefined time assignment algorithm.

Here, the first delaying part may configure an output calculation period for each of the plurality of delaying blocks based on a number of the plurality of delaying blocks, delay one of the first input values, and output the delayed one of the first input values in the configured output calculation period.

Here, the first calculating part may include a plurality of multipliers and a plurality of adders, and a number of the plurality of multipliers is identical to a number of the delaying blocks, and a number of the plurality of adders is one less than the number of the plurality of multipliers.

Also, the second calculating part may generate the second output value for calculation periods corresponding to odd-numbered coefficients of the interpolation filter among calculation periods.

Also, the second calculating part may further comprises a second delaying part delaying one of the second input values based on the second enable signal; a second muxing part selecting the delayed one of the second input values based on a configured output calculation period, and outputting the delayed one of the second input values; a second operating part generating a second output candidate value by generating second multiplication results for the outputs of the second muxing part and second coefficients of the interpolation filter and adding the second multiplication results; and a second selecting part selecting one of the second input values or the second output candidate value as the second output value based on an operation mode of the interpolation filter.

Here, the second delaying part may include a plurality of delaying blocks connected in a cascade structure, and each of the plurality of delaying blocks may delay one of the second input values and output the delayed one of the second input values based on a predefined time assignment algorithm.

Here, the second delaying part may configure an output calculation period for each of the plurality of delaying blocks based on a number of the plurality of delaying blocks, delay one of the second input values, and output the delayed one of the second input values in the configured output calculation period.

Here, the second calculating part may include a plurality of multipliers and a plurality of adders, and a number of the plurality of multipliers is identical to a number of the delaying blocks, and a number of the plurality of adders is one less than the number of the plurality of multipliers.

Also, the output selecting part may delay the second output value by a predetermined value, select one of the first output value and the second output value which is delayed by the predetermined value based on a control signal, and output the selected value.

BRIEF DESCRIPTION OF DRAWINGS

Example embodiments of the present invention will become more apparent by describing in detail example embodiments of the present invention with reference to the accompanying drawings, in which:

FIG. 10 is a conceptual diagram illustrating multiplier use time for each delayed block in an interpolation filter;

DESCRIPTION OF EXAMPLE EMBODIMENTS

Figure 1:
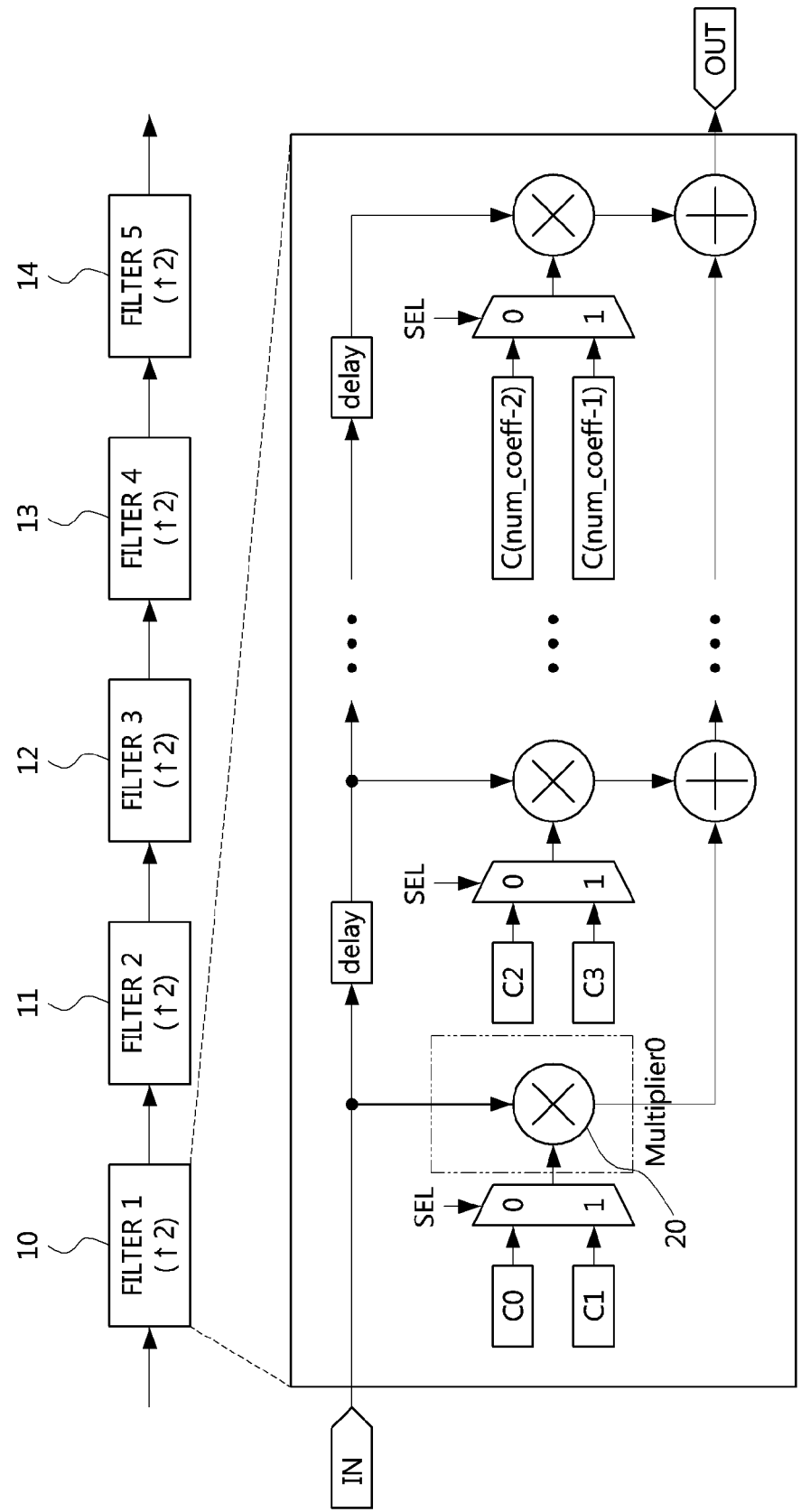
FIG. 1 is a block diagram illustrating an interpolating filter having a cascade structure.

Example embodiments of the present invention are disclosed herein. However, specific structural and functional details disclosed herein are merely representative for purposes of describing example embodiments of the present invention, however, example embodiments of the present invention may be embodied in many alternate forms and should not be construed as limited to example embodiments of the present invention set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating an interpolating filter having a cascade structure.

Referring to FIG. 1, a plurality of filters are connected in the cascade manner. That is, a first filter 10, a second filter 11, a third filter 12, a fourth filter 13, and a fifth filter 14 may be connected in series. The filters 10 to 14 may have the same configuration. In this case, a multiplier 20 of the first filter 10 may perform an operation for the first filter 10 by performing a multiplication operation on inputs for the first filter 10, and the multiplier 20 of the second filter 11 may perform an operation for the second filter 11 by performing a multiplication operation on inputs for the second filter 11 (that is, outputs of the first filer 10).

Also, the multiplier 20 of the third filter 12 may perform an operation for the third filter 12 by performing a multiplication operation on inputs for the third filter 12 (that is, outputs of the second filter 11), and the multiplier 20 of the fourth filter 13 may perform an operation for the fourth filter 13 by performing a multiplication operation on inputs for the fourth filter 13 (that is, outputs of the third filer 12), and the multiplier 20 of the fifth filter 14 may perform an operation for the fifth filter 14 by performing a multiplication operation on inputs for the fifth filter 14 (that is, outputs of the fourth filer 13).

Therefore, if input time for each multiplier for each of the filters 10 to 14 is configured differently for each of filters having the same structure, outputs of all the filters (that is, the filters 10 to 14) can be generated by using a single multiplier. The basic idea of the present invention starts from the above concept.

Figure 2:
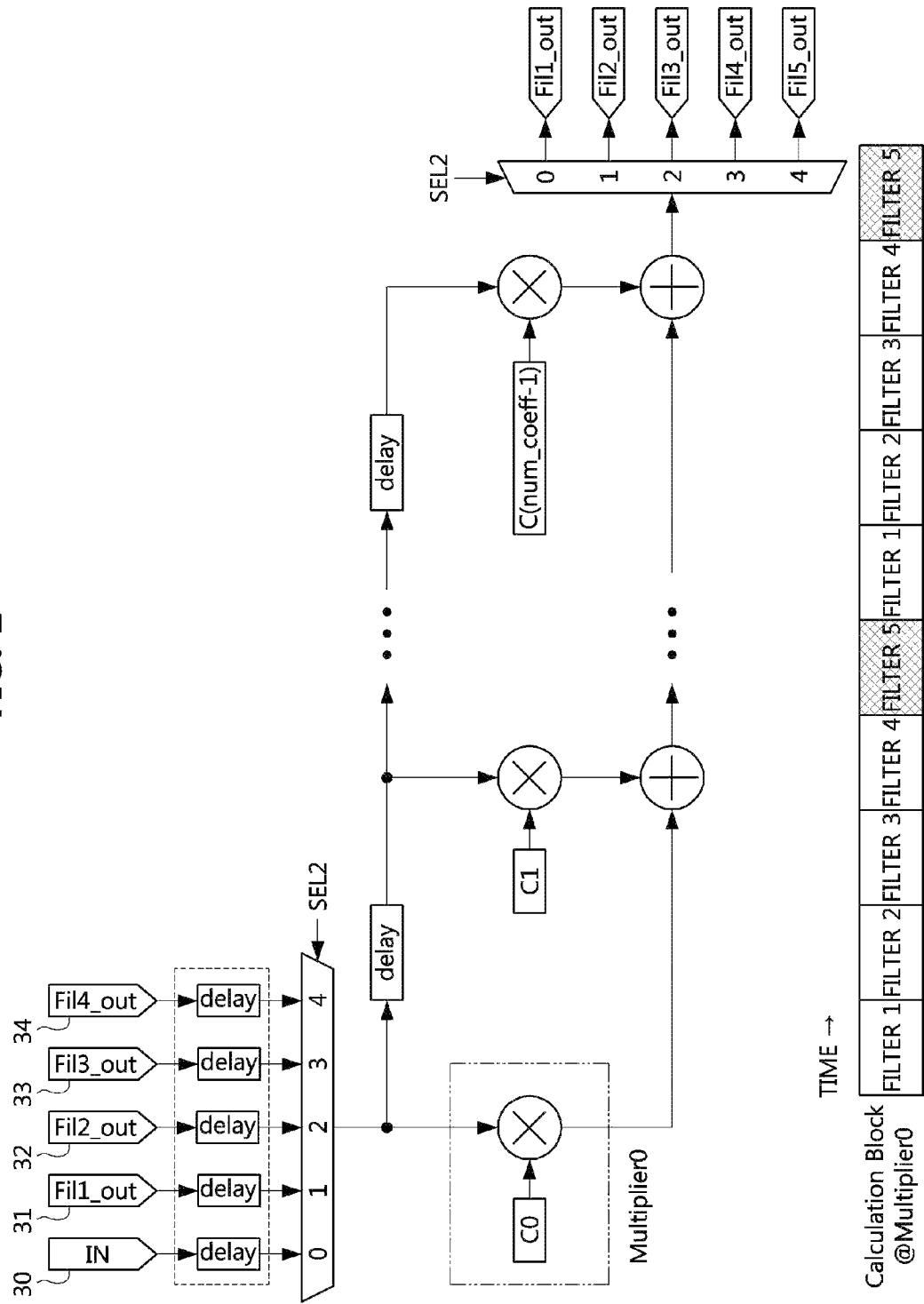
FIG. 2 is a block diagram illustrating an interpolation filter having a shared multiplier.

FIG. 2 is a block diagram illustrating an interpolation filter having a shared multiplier.

Referring to FIG. 2, although the interpolation filter illustrated in FIG. 2 does not have a cascade structure in which a plurality of blocks are connected, it has a structure corresponding to a single block used in the cascade structure. In this case, the interpolation filter may configure delay time differently for each of inputs for the filters (a first input 30 IN, a second input 31 Fil1_out, a third input 32 Fil2_out, a fourth input 33 Fil3_out, and a fifth input 34 Fil4_out), so that a plurality of outputs can be generated.

However, there may be a problem that it is difficult to guarantee a continuity of outputs.

Figure 3:
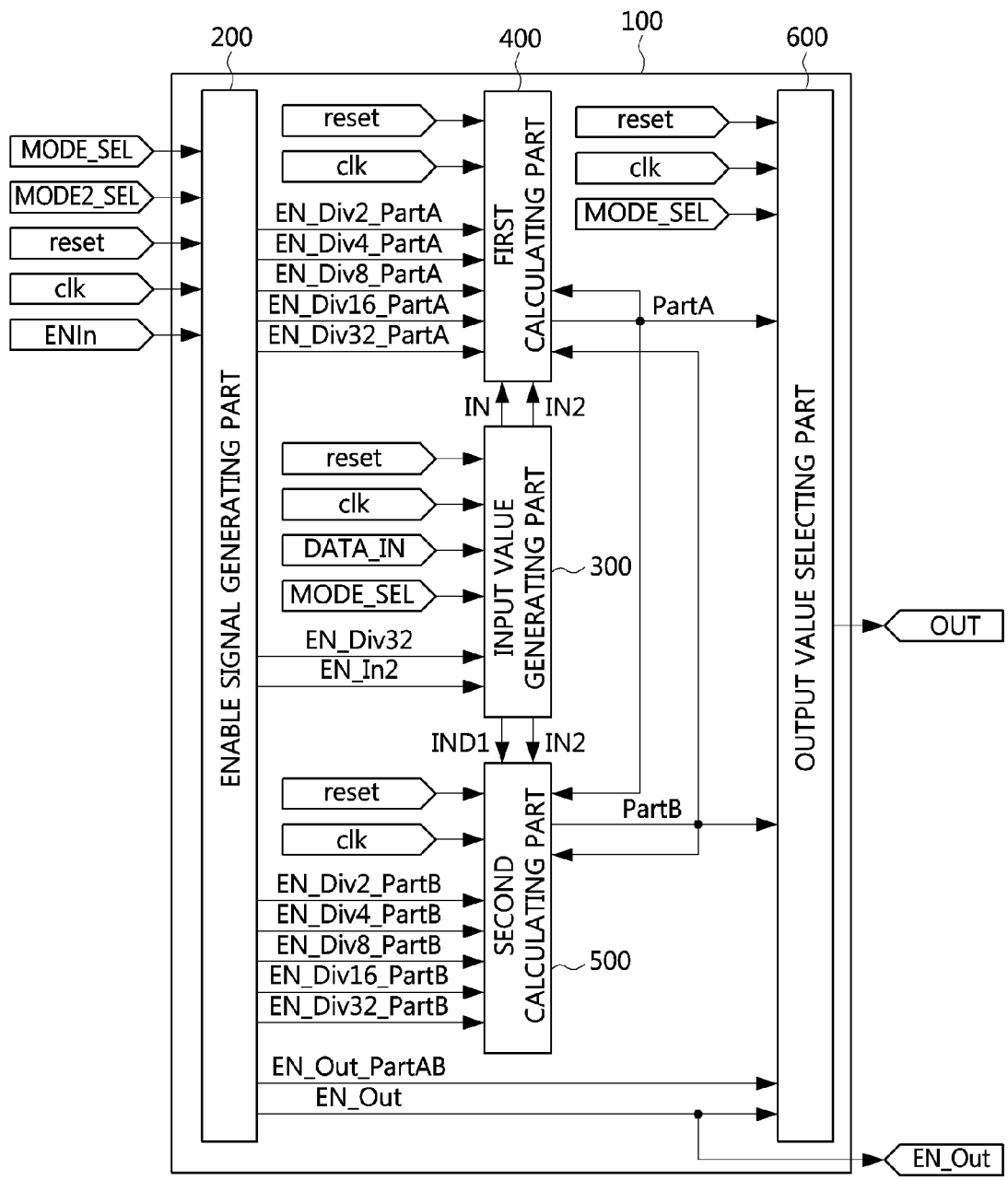
FIG. 3 is a block diagram illustrating an interpolation filter according to an example embodiment of the present invention.

FIG. 3 is a block diagram illustrating an interpolation filter according to an example embodiment of the present invention.

Referring to FIG. 3, an interpolation filter may comprise an enable signal generating part 200, an input value generating part 300, a first calculating part 400, a second calculating part 500, and an output value selecting part 600.

The enable signal generating part 200 may generate enable signals for operations of the interpolation filter based on a demanded sampling rate. The input value generating part 300 may generate input values from arbitrary data. The first calculating part 400 may generate a first output value having the demanded sampling rate based on a first enable signal among the enable signals and a first input value among the input values. The second calculating part 500 may generate a second output value having the demanded sampling rate based on a second enable signal among the enable signals and a second input value among the input values. Also, the output value selecting part 600 may select a final output value among the first output value and the second output value based on preconfigured selection criteria.

Specifically, the enable signal generating part 200 may determine an over-sampling rate based on interpolation filter operating mode configuration values MODE_SEL and MODE2_SEL and an enable input signal ENIn, and generate enable signals EN_Div2_PartA, EN_Div4_PartA, EN_Div8_PartA, EN_Div16_PartA, EN_Div32_PartA, EN_Div2_PartB, EN_Div4_PartB, EN_Div8_PartB, EN_Div16_PartB, EN_Div32_PartB, EN_Div32, EN_In2, EN_Out_PartAB, and EN_Out in order to drive each component of the interpolation filter 100.

The enable signal generating part 200 may generate the enable signals by dividing a clock signal 'clk' used in the components of the interpolation filter 100 by predetermined values. For example, the enable signal generating part 200 may generate an enable signal for the input value generating part 300, an enable signal for the first calculating part 400, an enable signal for the second calculating part 500, an enable signal for the output value selecting part 600, etc. by dividing the clock signal by 2 to $2^N$ (N is a positive integer).

Here, the enable signal generating part 200 may generate EN_Div32 and EN_In2 as the enable signal for the input value generating part 300, and provide the generated enable signal to the input signal generating part 300. The enable signal generating part 200 may generate EN_Div2_PartA, EN_Div4_PartA, EN_Div8_PartA, EN_Div16_PartA, and EN_Div32_PartA as the enable signals for the first calculating part 400, and provide the generated enable signals to the first calculating part 400. The enable signal generating part 200 may generate EN_Div2_PartB, EN_Div4_PartB, EN_Div8_PartB, EN_Div16_PartB, and EN_Div32_PartB as the enable signals for the second calculating part 500, and provide the generated signals to the second calculating part 500. The enable signal generating part 200 may generate EN_Out_PartAB and EN_Out as the enable signals for the output value selecting part 600, and provide the generated signals to the output value selecting part 600.

The input value generating part 300 may generate input values IN, IND1, and IN2 from inputted data DATA_IN, provide first input values IN, IN2 among the input values to the first calculating part 400, and provide second input values IND1, IN2 among the input values to the second calculating part 500. That is, the input value generating part 300 may generate the input values IN, IND1, and IN2 according to the rate of the input data DATA_IN based on time assignment algorithm.

The input value generating part 300 may generate the first input values for the first calculating part 400 and the second input values for the second calculating part 500 based on the interpolation filter operation mode MODE_SEL.

When a maximum value for a demanded sampling rate (that is, a sampling rate for final output) is defined as Fs_max, if the rate of the input data DATA_IN is Fs_max/($2^N$), the input value generating part 300 may generate the input values IN, IND1, and IN2 through the following pseudo code. Here, N is a variable for generating an interpolated output to which the input data is oversampled by maximum $2^N$ times, and may be a natural number equal to or more than 1. In an example embodiment of the present invention, 5 is used for N in order to increase the sampling rate by 32 times as a maximum rate.

[Pseudo code]

```
IF (input data (DATA_IN) rate = Fs_max/(2^N))
    IN = DATA IN(i_ynum)@PartAtime_Fill1(0)
    IND1 = DATA IN(i_ynum)@PartBtime_Fill1(0)
    IN2 = 0 ← i_ynum ≥ 0
Else If (input data (DATA_IN) rate = Fs_max/(2^(N-y)))
    IN = IND1 = 0,
    IN2 = DATA IN(2^y*i_ynum + 2*i_ytime)@PartAtime_Fily(i_ytime)
    IN2 = DATA IN(2^y*i_ynum + 2*i_ytime + 1)@PartBtime_Fily(i_ytime)
    ← y = 1∼(N−1), i_ynum ≥ 0, i_ytime = 0∼{2^(y−1)−1}
Else
    IN = IND1 = IN2 = 0
```

Here, DATA_IN($i_{ynum}$) means the input data, and the meanings of PartAtime and PartBtime will be explained in the following descriptions.

Figure 4:
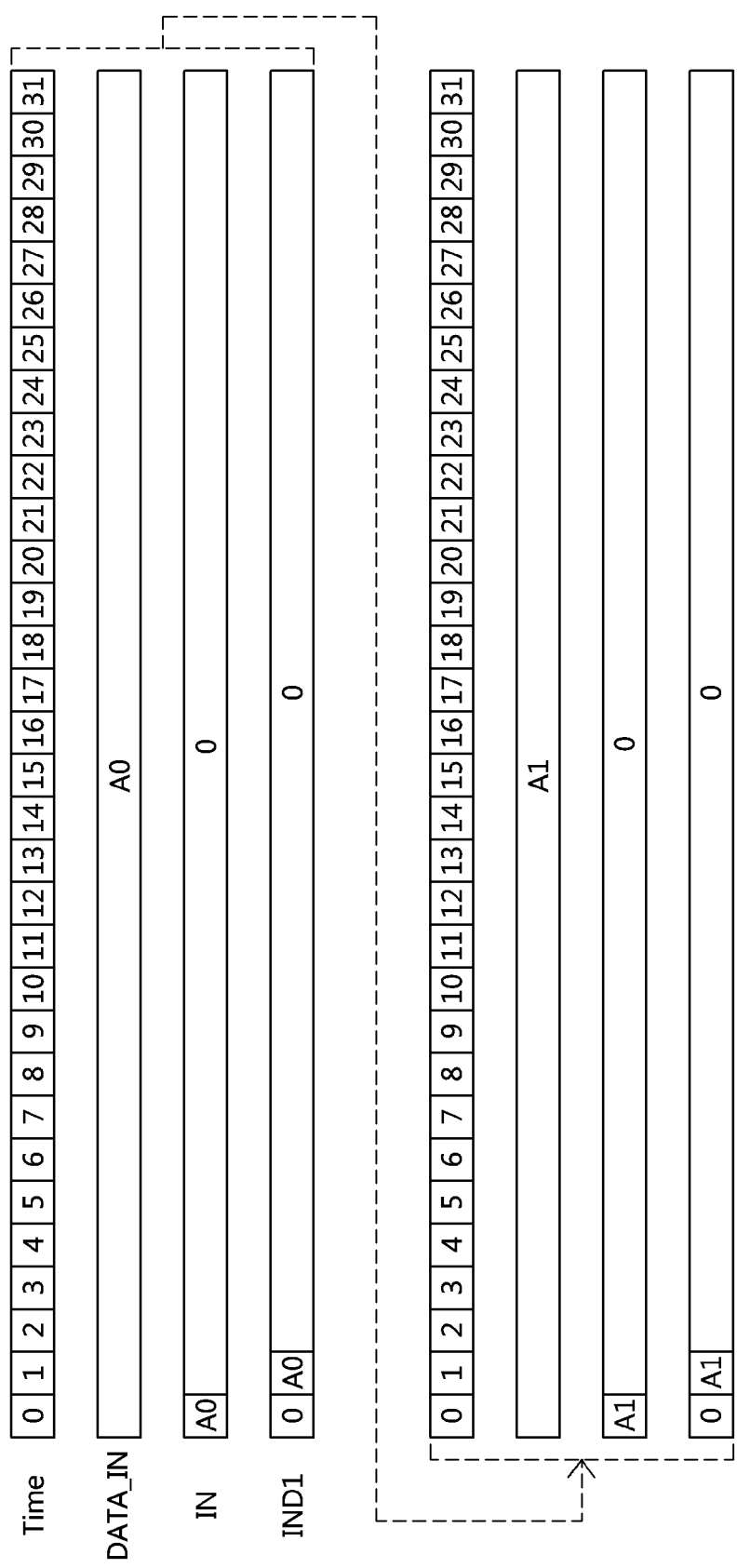
FIG. 4 is a conceptual diagram illustrating a first example embodiment of input values generated in the input value generating part.

FIG. 4 is a conceptual diagram illustrating a first example embodiment of input values generated in the input value generating part. Here, the input values generated by the pseudo code, when N=5, Fs_max=$2^N$, and the rate of input data=1, are illustrated in FIG. 4.

Referring to FIG. 4, when the rate of the input data DATA_IN is 1 and a current value of the input data is A0, the input value IN may have a value of A0 in a frame 0, and the input value IND1 may have a value of A0 in a frame 1. When the rate of the input data DATA_IN is 1, and a current value of the input data is A1, the input value IN may have a value of A1 in a frame 0, and the input value IND1 may have a value of A1 in a frame 1.

Figure 5:
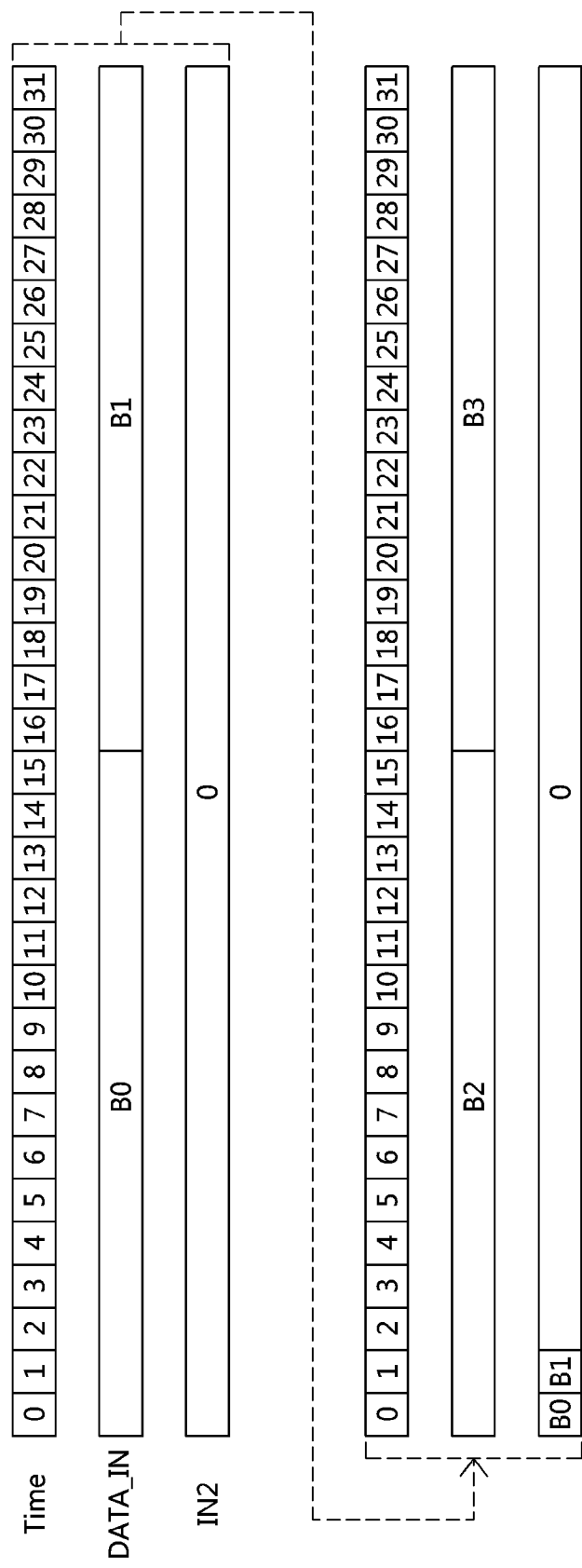
FIG. 5 is a conceptual diagram illustrating a second example embodiment of input values generated in the input value generating part.

FIG. 5 is a conceptual diagram illustrating a second example embodiment of input values generated in the input value generating part. Here, the input values generated by the pseudo code, when N=5, Fs_max=$2^N$, and the rate of input data=2, are illustrated in FIG. 5.

Referring to FIG. 5, when the rate of the input data DATA_IN is 2 and a current value of the input data is B2, the input value IN2 may have a previous input value B0 in the frame 0 and a previous input value B1 in the frame 1.

Figure 6:
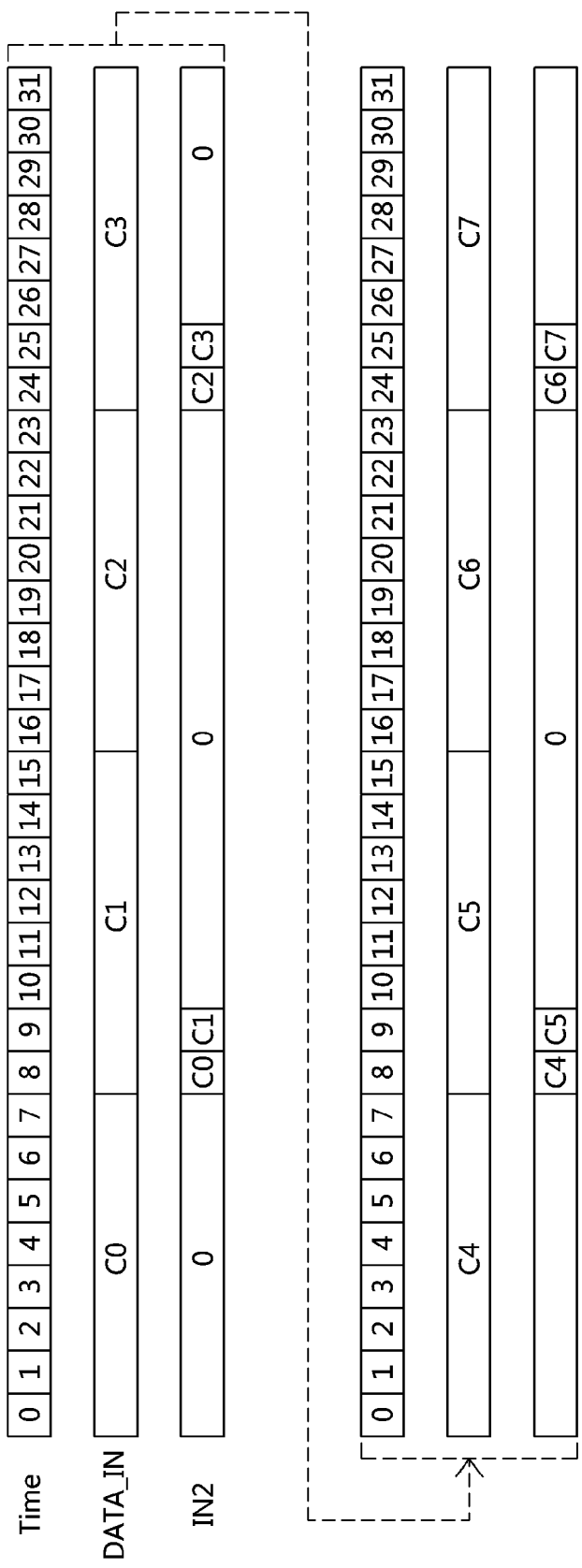
FIG. 6 is a conceptual diagram illustrating a third example embodiment of input values generated in the input value generating part.

FIG. 6 is a conceptual diagram illustrating a third example embodiment of input values generated in the input value generating part. Here, the input values generated by the pseudo code, when N=5, Fs_max=$2^N$, and the rate of input data=4, are illustrated in FIG. 6.

Referring to FIG. 6, when the rate of the input data DATA_N is 4 and a current value of the input data is C1, the input value IN2 may have a previous input value C0 in a frame 8 and a current input value C1 in a frame 9. Also, when the rate of the input data DATA_IN is 4 and a current value of the input data is C3, the input value IN2 may have a previous input value C2 in a frame 24 and a current input value C3 in a frame 25. Also, when the rate of the input data DATA_IN is 4 and a current value of the input data is C5, the input value IN2 may have a previous input value C4 in the frame 8 and a current input value C5 in the frame 9. Also, when the rate of the inputted data (DATA_IN) is 4 and a value of the data is C7, the input value IN2 may have a previous input value C6 in the frame 24 and a current input value C7 in the frame 25.

Figure 7:
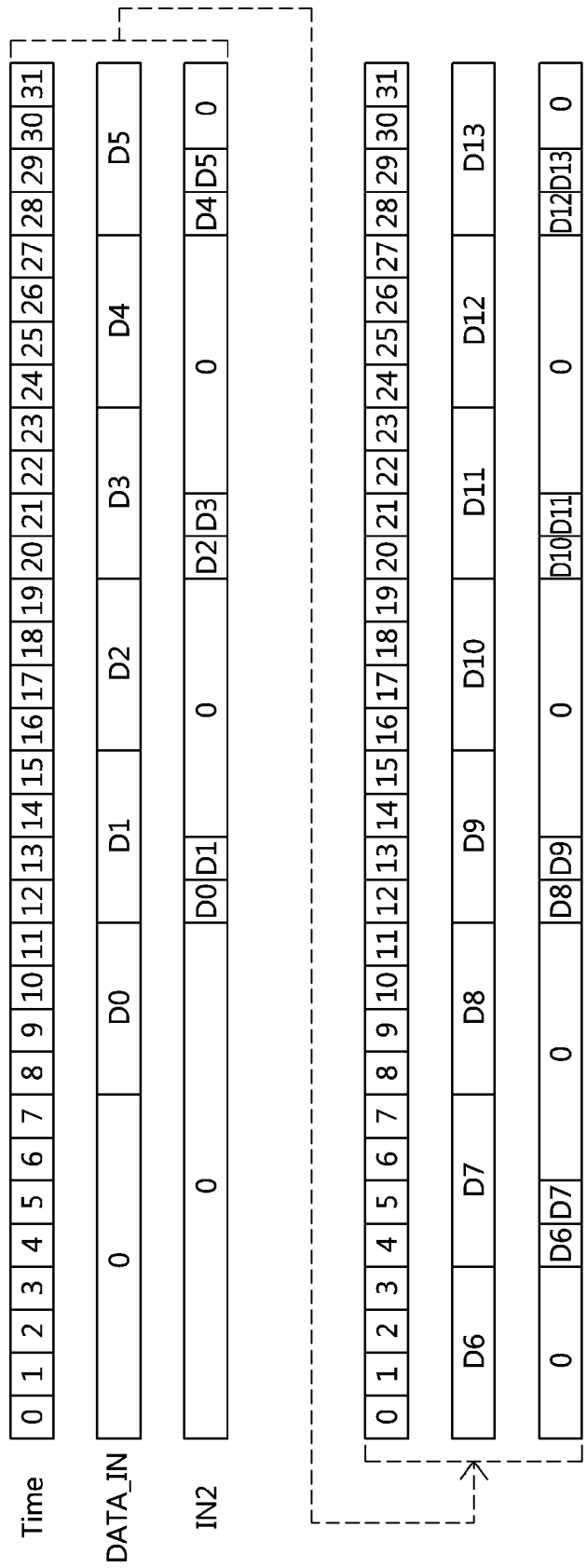
FIG. 7 is a conceptual diagram illustrating a fourth example embodiment of input values generated in the input value generating part.

FIG. 7 is a conceptual diagram illustrating a fourth example embodiment of input values generated in the input value generating part. Here, the input values generated by the pseudo code, when N=5, Fs_max=$2^N$, and the rate of input data=8, are illustrated in FIG. 7.

Referring to FIG. 7, when the rate of the input data DATA_IN is 8 and a current value of the input data is D1, the input value IN2 may have a previous input value D0 in a frame 12 and a current input value D1 in a frame 13. Also, when the rate of the input data DATA_IN is 8 and a current value of the data is D3, the input value IN2 may have a previous input value D2 in a frame 20 and a current input value D3 in a frame 21. Also, when the rate of the input data DATA_IN is 8 and a current value of the input data is D5, the input value IN2 may have a previous input value D4 in a frame 28 and a current input value D5 in a frame 29.

Also, when the rate of the input data DATA_IN is 8 and a current value of the input data is D7, the input value IN2 may have a previous input value D6 in a frame 4 and a current input value D7 in a frame 5. Also, when the rate of the input data DATA_IN is 8 and a current value of the data is D9, the input value IN2 may have a previous input value D8 in a frame 12 and a current input value D9 in a frame 13. Also, when the rate of the input data DATA_IN is 8 and a current value of the data is D11, the input value IN2 may have a previous input value D10 in a frame 20 and a current input value D11 in a frame 21. Also, when the rate of the input data DATA_IN is 8 and a current value of the input data is D13, the input value IN2 may have a previous input value D12 in a frame 28 and a current input value D13 in a frame 29.

Figure 8:
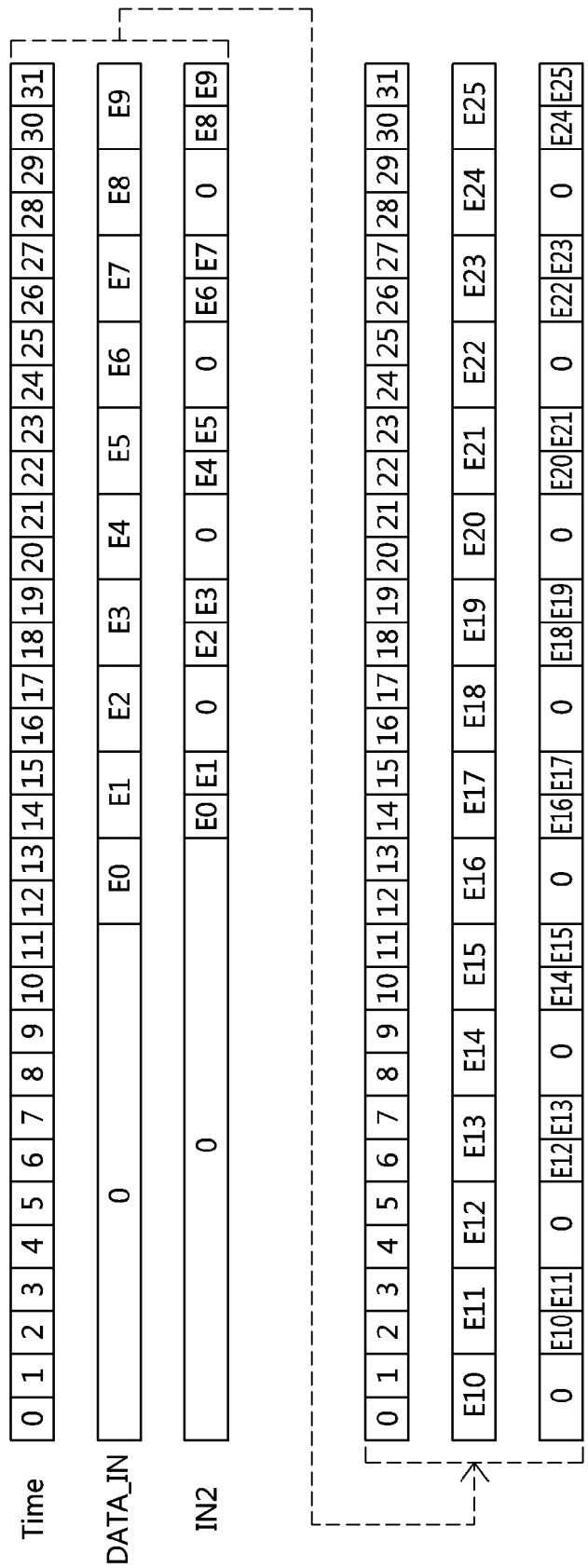
FIG. 8 is a conceptual diagram illustrating a fifth example embodiment of input values generated in the input value generating part.

FIG. 8 is a conceptual diagram illustrating a fifth example embodiment of input values generated in the input value generating part. Here, the input values generated by the pseudo code, when N=5, Fs_max=$2^N$, and the rate of input data=16, are illustrated in FIG. 8.

Referring to FIG. 8, when the rate of the input data DATA_IN is 16 and a current value of the input data is E1, the input value IN2 may have a previous input value E0 in a frame 14 and a current input value E1 in a frame 15. When the rate of the input data DATA_IN is 16 and a current value of the input data is E3, the input value IN2 may have a previous input value E2 in a frame 18 and a current input value E3 in a frame 19. When the rate of the input data DATA_IN is 16 and a current value of the input data is E5, the input value IN2 may have a previous input value E4 in a frame 22 and a current input value E5 in a frame 23. When the rate of the input data DATA_IN is 16 and a current value of the input data is E7, the input value IN2 may have a previous input value E6 in a frame 26 and a current input value E7 in a frame 27. When the rate of the input data DATA_IN is 16 and a current value of the input data is E9, the input value IN2 may have a previous input value E8 in a frame 30 and a current input value E9 in a frame 31. When the rate of the input data DATA_IN is 16 and a current value of the input data is E11, the input value IN2 may have a previous input value E10 in a frame 2 and a current input value E11 in a frame 3. When the rate of the input data DATA_IN is 16 and a current value of the input data is E13, the input value IN2 may have a previous input value E12 in a frame 6 and a current input value E13 in a frame 7. When the rate of the input data DATA_IN is 16 and a current value of the input data is E15, the input value IN2 may have a previous input value E14 in a frame 10 and a current input value E15 in a frame 11.

Also, when the rate of the input data DATA_IN is 16 and a current value of the input data is E17, the input value IN2 may have a previous input value E16 in a frame 14 and a current input value E17 in a frame 15. When the rate of the input data DATA_IN is 16 and a current value of the input data is E19, the input value IN2 may have a previous input value E18 in a frame 18 and a current input value E19 in a frame 19. When the rate of the input data DATA_IN is 16 and a current value of the input data is E21, the input value IN2 may have a previous input value E20 in a frame 22 and a current input value E21 in a frame 23. When the rate of the input data DATA_IN is 16 and a value of the data is E23, the input value IN2 may have a previous input value E22 in a frame 26 and a current input value E23 in a frame 27. When the rate of the input data DATA_IN is 16 and a current value of the input data is E25, the input value IN2 may have a previous input value E24 in a frame 30 and a current input value E25 in a frame 31.

Figure 9:
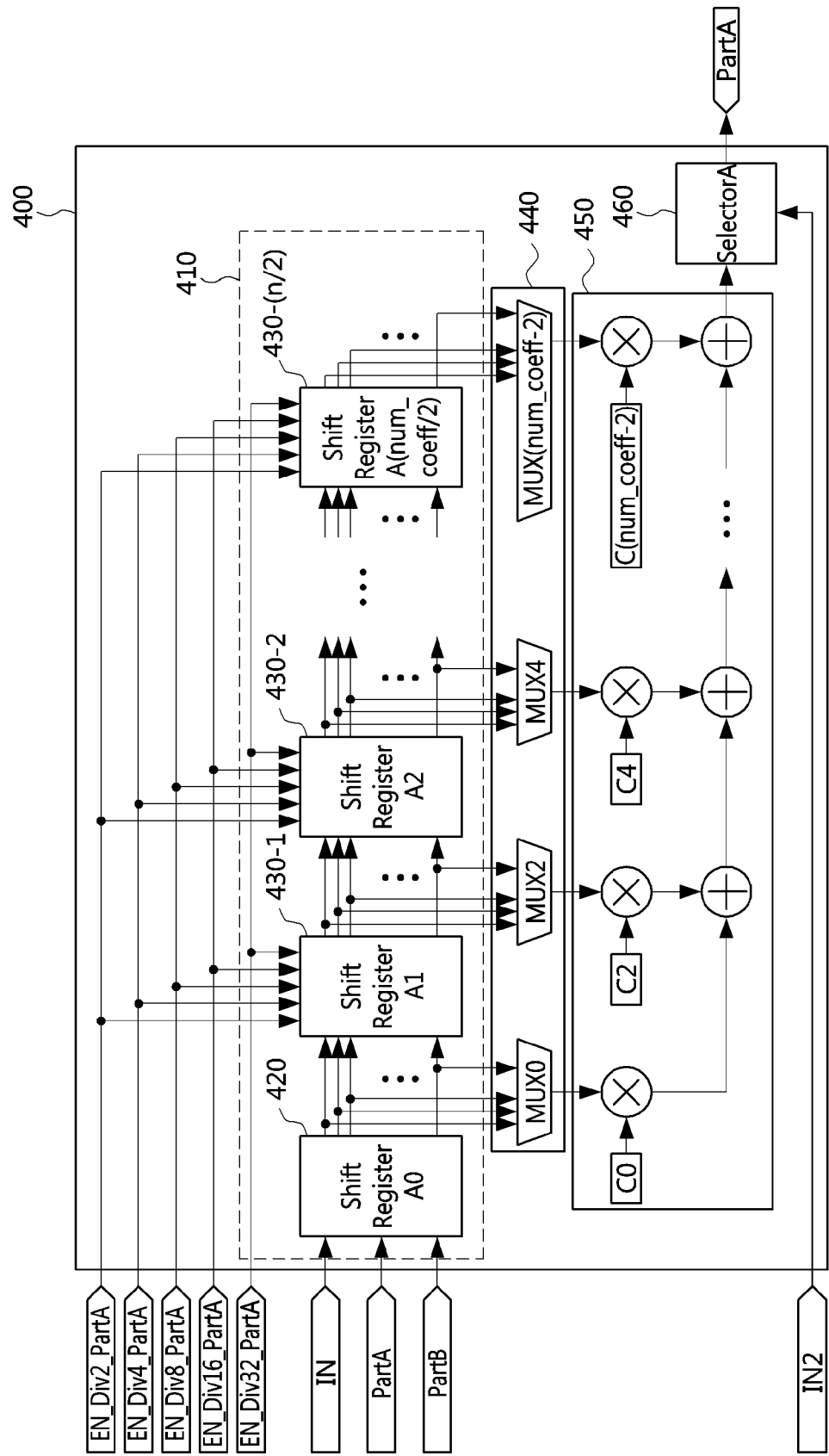
FIG. 9 is a block diagram illustrating a first calculating part included in an interpolation filter according to an example embodiment of the present invention.

FIG. 9 is a block diagram illustrating a first calculating part included in an interpolation filter according to an example embodiment of the present invention.

Referring to FIG. 9, the first calculating part 400 may comprise a first delaying part 410, a first muxing part 440, a first operating part 450, and a first selecting part 460. The first delaying part 410 may generate a delay value for one of the first input values based on the first enable signal. The first muxing part 440 may select and output a delay value for the first input value based on a configured output calculation period. The first operating part 450 may generate first multiplication results for the outputs of the first muxing part and first coefficient values, and generate a first output candidate value by summing the first multiplication results. Here, the first coefficient values mean even-numbered coefficients (C0, C2, . . . , C(num_coeff−2)) among coefficients of the interpolation filter. The first selecting part 460 may select one of the first input values or the first output candidate value as a first output value based on the interpolation filter operation mode.

Here, since the first calculating part 400 generates the first output value based on time assignment algorithm, the time assignment algorithm will be explained in further detail first.

In order to increase the input data rate by $2^N$ times at maximum, the interpolation filter based on time assignment algorithm uses $2^N$ time periods repetitively. Accordingly, operations performed for each time period of the $2^N$ time periods may be represented by time assignment algorithm.

Fs_max, a maximum output rate which the interpolation filter generates, is supposed to be $2^N$. If a variable $i_{Filx}$ is supposed to be a variable in which x is an integer value ranges 1 to N, the variable $i_{Filx}$ is used in $2^N$ time periods.

For example, when N=5, the variable $i_{Filx}$ may be $i_{Fil1}$, $i_{Fil2}$, $i_{Fil3}$, $i_{Fil4}$, and $i_{Fil5}$. The variable $i_{Fil1}$ may mean a single (that is, $2^{(1-1)}=1$) time period used when the input data rate is 1. In a case that X=2, the variable $i_{Fil2}$ may mean 2 (that is, $2^{(2-1)}=2$) time periods used when the input data rate is 2. In a case that X=3, the variable $i_{Fil3}$ may mean 4 (that is, $2^{(3-1)}=4$) time periods used when the input data rate is 4. In a case that X=4, the variable $i_{Fil4}$ may mean 8 (that is, $2^{(4-1)}=8$) time periods used when the input data rate is 8. In a case that X=5, the variable $i_{Fil5}$ may mean 16 (that is, $2^{(5-4)}=16$) time periods used when the input data rate is 16.

In $2^N$ time periods ranged 0 to $2^N-1$, calculation periods for a part A (that is, a part calculated by the first calculating part 400) and calculation periods for a part B (that is, another part calculated by the second calculating part 500) may be separated. The part A is a part related to even-numbered coefficients of the interpolation filter, and the part B is a part related to odd-numbered coefficients of the interpolation filter.

If the calculation periods for the part A is defined as PartAtime$_{Filx}$, they may be represented as the following equation 1. Also, if the calculation periods for the Part B is defined as PartBtime$_{Filx}$, they may be represented as the following equation 2.

PartAtime$_{Filx}$=mod {(Filx$_{PartAstart}$+$2^{(N-x+1)}$·$i_{Filx}$), $2^N$}←x=1~N, $i_{Filx}$=0~{$2^{(x-1)}$−1}

If(x=1)→Filx$_{PartA\_start}$=Fil1$_{PartA\_start}$=0

Else(1<x≤N)→Filx$_{PartA\_start}$=Fil(x−1)$_{PartA\_start}$+$2^{(N-x)}$   [Equation 1]

partBtime$_{Filx}$=mod {(Filx$_{PartBstart}$+$2^{(N-x+1)}$·$i_{Filx}$), $2^N$}←x=1~N, $i_{Filx}$=0~{$2^{(x-1)}$−1}

If(x=1)←Filx$_{PartB\_start}$=Fil1$_{PartB\_start}$=1

Else(1<x≤N)←Filx$_{PartB\_start}$=Fil(x−1)$_{PartB\_start}$+$2^{(N-x)}$   [Equation 2]

When N=5, according to the equation 1, the calculation periods for the part A PartAtime$_{Fil1}$ when input data rate is 1 may be {0}. The calculation periods for the part A PartAtime$_{Fil2}$ when input data rate is 2 may be {8, 24}. The calculation periods for the part A PartAtime$_{Fil3}$ when input data rate is 4 may be {12, 20, 28, 4}. The calculation periods for the part A PartAtime$_{Fil4}$ when input data rate is 8 may be {14, 18, 22, 26, 30, 2, 6, 10}. Also, the calculation periods for the part A PartAtime$_{Fil5}$ when input data rate is 16 may be {15, 17, 19, 21, 23, 25, 27, 29, 31, 1, 3, 5, 7, 9, 11, 13}.

Thus, a set of PartAtime(0:31) may be represented as a set of PartAtime$_{Fil1}$~PartAtime$_{Fil5}$ which are time periods assigned for each input data rate among time periods corresponding to 0 to 31. The relation may be represented in the following equation 3.

$$N = 5 \quad \text{[Equation 3]}$$

$$i_{Fil1} = \{0\} \rightarrow PartAtime_{Fil1}$$
$$= \text{mod}\{(Fil1_{PartA\_start} + 2^{(5-1+1)} \cdot i_{Fil1}), 2^5\}$$
$$= \{0\}$$

$$i_{Fil2} = \{0, 1\} \rightarrow PartAtime_{Fil2}$$
$$= \text{mod}\{(Fil2_{PartA\_start} + 2^{(5-2+1)} \cdot i_{Fil2}), 2^5\}$$
$$= \{8, 24\}$$

$$i_{Fil3} = \{0, 1, 2, 3\} \rightarrow PartAtime_{Fil3}$$
$$= \text{mod}\{(Fil3_{PartA\_start} + 2^{(5-3+1)} \cdot i_{Fil3}), 2^5\}$$
$$= \{12, 20, 28, 4\}$$

$$i_{Fil4} = \{0, 1, 2, 3, 4, 5, 6, 7\} \rightarrow PartAtime_{Fil4}$$
$$= \text{mod}\{(Fil4_{PartA\_start} + 2^{(5-4+1)} \cdot i_{Fil4}), 2^5\}$$
$$= \{14, 18, 22, 26, 30, 2, 6, 10\}$$

$$i_{Fil5} = \{0, 1, 2, 3, 4, 5, 6, 7, 8, 10, 11, 12, 13, 14, 15\} \rightarrow PartAtime_{Fil5}$$
$$= \text{mod}\{(Fil5_{PartA\_start} + 2^{(5-5+1)} \cdot i_{Fil5}), 2^5\}$$
$$= \{15, 17, 19, 21, 23, 25, 27, 29, 31,$$
$$\quad 1, 3, 5, 7, 9, 11, 13\}$$

$$PartAtime(0) = PartAtime_{Fil1}(0)$$
$$= \{0\}$$
$$PartAtime(1) = PartAtime_{Fil5}(9)$$
$$= \{1\}$$
$$PartAtime(2) = PartAtime_{Fil4}(5)$$
$$= \{2\}$$
$$PartAtime(3) = PartAtime_{Fil5}(10)$$
$$= \{3\}$$
$$PartAtime(4) = PartAtime_{Fil3}(3)$$
$$= \{4\}$$
$$PartAtime(5) = PartAtime_{Fil5}(11)$$
$$= \{5\}$$
$$PartAtime(6) = PartAtime_{Fil4}(6)$$
$$= \{6\}$$
$$PartAtime(7) = PartAtime_{Fil5}(12)$$
$$= \{7\}$$

-continued $PartAtime(8) = PartAtime_{Fil2}(0)$
$= \{8\}$ $PartAtime(9) = PartAtime_{Fil5}(13)$
$= \{9\}$ $PartAtime(10) = PartAtime_{Fil4}(7)$
$= \{10\}$ $PartAtime(11) = PartAtime_{Fil5}(14)$
$= \{11\}$ $PartAtime(12) = PartAtime_{Fil3}(0)$
$= \{12\}$ $PartAtime(13) = PartAtime_{Fil5}(15)$
$= \{13\}$ $PartAtime(14) = PartAtime_{Fil4}(0)$
$= \{14\}$ $PartAtime(15) = PartAtime_{Fil5}(0)$
$= \{15\}$ $PartAtime(16) = (0)$
$= \{16\}$ $PartAtime(17) = PartAtime_{Fil5}(1)$
$= \{17\}$ $PartAtime(18) = PartAtime_{Fil4}(1)$
$= \{18\}$ $PartAtime(19) = PartAtime_{Fil5}(2)$
$= \{19\}$ $PartAtime(20) = PartAtime_{Fil3}(1)$
$= \{20\}$ $PartAtime(21) = PartAtime_{Fil5}(3)$
$= \{21\}$ $PartAtime(22) = PartAtime_{Fil4}(2)$
$= \{22\}$ $PartAtime(23) = PartAtime_{Fil5}(4)$
$= \{23\}$ $PartAtime(24) = PartAtime_{Fil2}(1)$
$= \{24\}$ $PartAtime(25) = PartAtime_{Fil5}(5)$
$= \{25\}$ $PartAtime(26) = PartAtime_{Fil4}(3)$
$= \{26\}$ $PartAtime(27) = PartAtime_{Fil5}(6)$
$= \{27\}$ $PartAtime(28) = PartAtime_{Fil3}(2)$
$= \{26\}$ $PartAtime(29) = PartAtime_{Fil5}(7)$
$= \{29\}$ $PartAtime(30) = PartAtime_{Fil4}(4)$
$= \{30\}$ $PartAtime(31) = PartAtime_{Fil5}(8)$
$= \{31\}$ When N=5, according to the equation 2, the calculation periods for the part B $PartBtime_{Fil1}$ when input data rate is 1 may be $\{1\}$. The calculation periods for the part B $PartBtime_{Fil2}$ when input data rate is 2 may be $\{9, 25\}$. The calculation periods for the part B $PartBtime_{Fil3}$ when input data rate is 4 may be $\{13, 21, 29, 5\}$. The calculation periods for the part B $PartBtime_{Fil4}$ when input data rate is 8 may be $\{15, 19, 23, 27, 31, 3, 7, 11\}$. Also, the calculation periods for the part B $PartBtime_{Fil5}$ when input data rate is 16 may be $\{16, 18, 20, 22, 24, 26, 28, 30, 0, 2, 4, 6, 8, 10, 12, 14\}$.

Thus, a set of PartBtime(0:31) may be represented as a set of $PartBtime_{Fil1} \sim PartBtime_{Fil5}$ which are time periods assigned for each input data rate among time periods corresponding to 0 to 31. The relation may be represented in the following equation 4.

$$N = 5 \qquad \text{[Equation 4]}$$

$i_{Fil1} = 0 \rightarrow PartBtime_{Fil1}$
$= \mod\{(Fil1_{PartB\_start} + 2^{(5-1+1)} \cdot i_{Fil1}), 2^5\}$
$= \{1\}$ $i_{Fil2} = \{0, 1\} \rightarrow PartBtime_{Fil2}$
$= \mod\{(Fil2_{PartB\_start} + 2^{(5-2+1)} \cdot i_{Fil2}), 2^5\}$
$= \{9, 25\}$ $i_{Fil3} = \{0, 1, 2, 3\} \rightarrow PartBtime_{Fil3}$
$= \mod\{(Fil3_{PartB\_start} + 2^{(5-3+1)} \cdot i_{Fil3}), 2^5\}$
$= \{13, 21, 29, 5\}$ $i_{Fil4} = \{0, 1, 2, 3, 4, 5, 6, 7\} \rightarrow PartBtime_{Fil4}$
$= \mod\{(Fil4_{PartB\_start} + 2^{(5-4+1)} \cdot i_{Fil4}), 2^5\}$
$= \{15, 19, 23, 27, 31, 3, 7, 11\}$ $i_{Fil5} = \{0, 1, 2, 3, 4, 5, 6, 7, 8, 10, 11, 12, 13, 14, 15\} \rightarrow PartBtime_{Fil5}$
$= \mod\{(Fil5_{PartB\_start} + 2^{(5-5+1)} \cdot i_{Fil5}), 2^5\}$
$= \{16, 18, 20, 22, 24, 26, 28, 30, 0, 2, 4, 6, 8, 10, 12, 14\}$ $PartBtime(0) = PartBtime_{Fil5}(8)$
$= \{0\}$ $PartBtime(1) = PartBtime_{Fil1}(0)$
$= \{1\}$ $PartBtime(2) = PartBtime_{Fil5}(9)$
$= \{2\}$ $PartBtime(3) = PartBtime_{Fil4}(5)$
$= \{3\}$ $PartBtime(4) = PartBtime_{Fil5}(10)$
$= \{4\}$ $PartBtime(5) = PartBtime_{Fil3}(3)$
$= \{5\}$ $PartBtime(6) = PartBtime_{Fil5}(11)$
$= \{6\}$ $PartBtime(7) = PartBtime_{Fil4}(6)$
$= \{7\}$ $PartBtime(8) = PartBtime_{Fil5}(12)$
$= \{8\}$ $PartBtime(9) = PartBtime_{Fil2}(0)$
$= \{9\}$ $PartBtime(10) = PartBtime_{Fil5}(13)$
$= \{10\}$ $PartBtime(11) = PartBtime_{Fil4}(7)$
$= \{11\}$ $PartBtime(12) = PartBtime_{Fil5}(14)$
$= \{12\}$ -continued $$PartBtime(13) = PartBtime_{Fil3}(0)$$
$$= \{13\}$$
$$PartBtime(14) = PartBtime_{Fil5}(15)$$
$$= \{14\}$$
$$PartBtime(15) = PartBtime_{Fil4}(0)$$
$$= \{15\}$$
$$PartBtime(16) = PartBtime_{Fil5}(0)$$
$$= \{16\}$$
$$PartBtime(17) = (0)$$
$$= \{17\}$$
$$PartBtime(18) = PartBtime_{Fil5}(1)$$
$$= \{18\}$$
$$PartBtime(19) = PartBtime_{Fil4}(1)$$
$$= \{19\}$$
$$PartBtime(20) = PartBtime_{Fil5}(2)$$
$$= \{20\}$$
$$PartBtime(21) = PartBtime_{Fil3}(1)$$
$$= \{21\}$$
$$PartBtime(22) = PartBtime_{Fil5}(3)$$
$$= \{22\}$$
$$PartBtime(23) = PartBtime_{Fil4}(2)$$
$$= \{23\}$$
$$PartBtime(24) = PartBtime_{Fil5}(4)$$
$$= \{24\}$$
$$PartBtime(25) = PartBtime_{Fil2}(1)$$
$$= \{25\}$$
$$PartBtime(26) = PartBtime_{Fil5}(5)$$
$$= \{26\}$$
$$PartBtime(27) = PartBtime_{Fil4}(3)$$
$$= \{27\}$$
$$PartBtime(28) = PartBtime_{Fil5}(6)$$
$$= \{28\}$$
$$PartBtime(29) = PartBtime_{Fil3}(2)$$
$$= \{29\}$$
$$PartBtime(30) = PartBtime_{Fil5}(7)$$
$$= \{30\}$$
$$PartBtime(31) = PartBtime_{Fil4}(4)$$
$$= \{31\}$$

Figure 10:
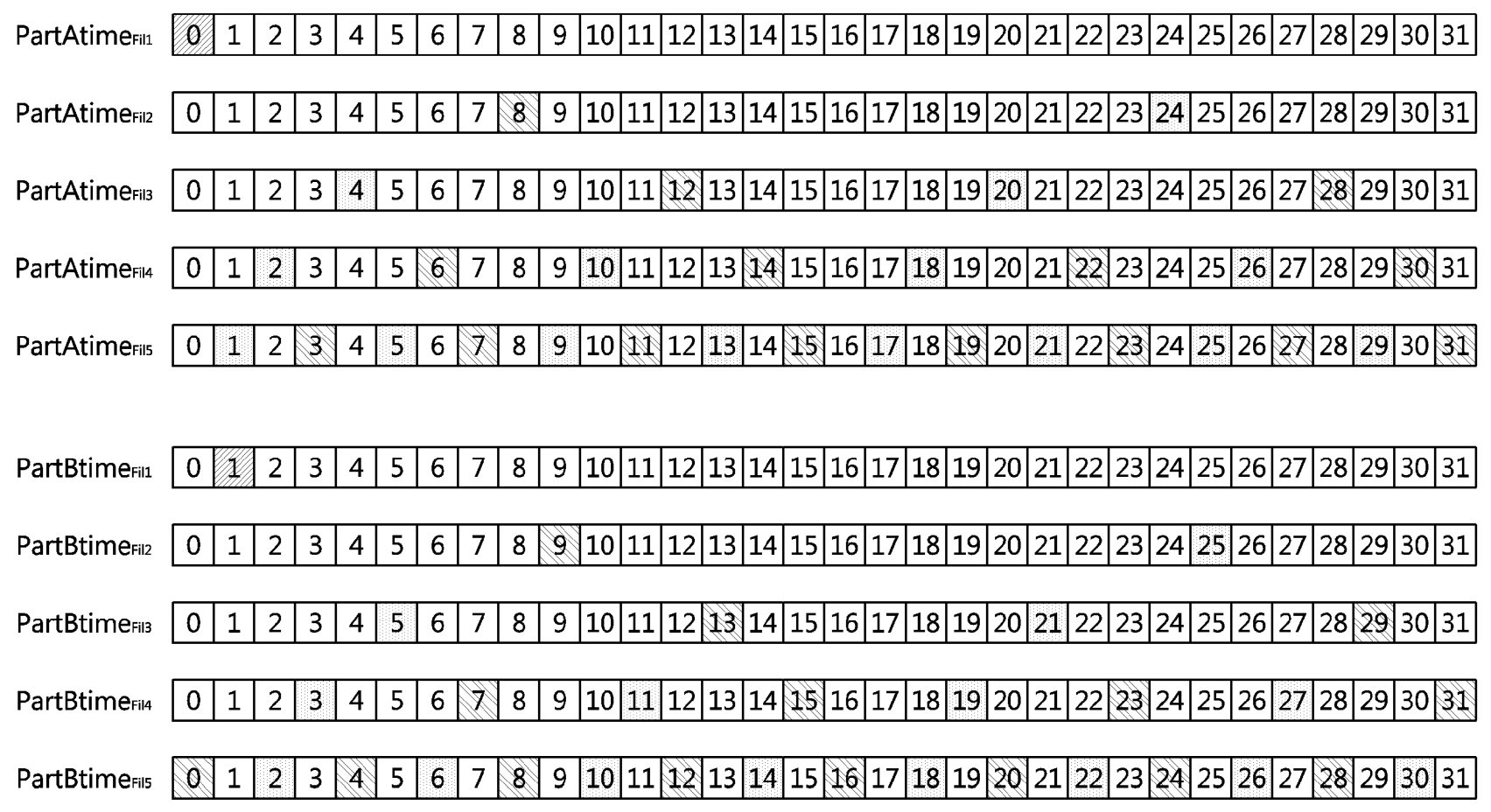

FIG. 10 is a conceptual diagram illustrating multiplier use time for each delayed block in an interpolation filter.

Referring to FIG. 10, according to time assignment based on the equations 1 and 2, periods corresponding to PartAtime($0:2^N-1$) and periods corresponding to PartBtime($0:2^N-1$), for periods ($0:2^N-1$) may be assigned when the input data rate is one of 1 to 16. Through the above time assignment, a multiplier is shared by changing input values for the multiplier. Also, continuity of output data may be guaranteed.

That is, in the assignment of calculation periods for the part A, when the input data rate is 1 (X=1), a time period (PartAtime$_{Fil1}$) used for the part A is allocated in a frame 0. Also, when the input data rate is 2 (X=2), time periods (PartAtime$_{Fil2}$) used for the part A are allocated in frames 8 and 24. Also, when the input data rate is 4 (X=3), time periods (PartAtime$_{Fil3}$) used for the part A are allocated in frames 12, 20, 28, and 4. Also, when the input data rate is 8 (X=4), time periods (PartAtime$_{Fil4}$) used for the part A are allocated in frames 14, 18, 22, 26, 30, 2, 6, and 10. Also, when the input data rate is 16 (X=5), time periods (PartAtime$_{Fil5}$) used for the part A are allocated in frames 15, 17, 19, 21, 23, 25, 27, 29, 31, 1, 3, 5, 7, 9, 11, and 13.

That is, in the assignment of calculation periods for the part B, when the input data rate is 1 (X=1), time period (PartBtime$_{Fil1}$) used for the part B is allocated in a frame 1. Also, when the input data rate is 2 (X=2), time periods (PartBtime$_{Fil2}$) used for the part B are allocated in frames 9 and 25. Also, when the input data rate is 4 (X=3), time periods (PartBtime$_{Fil3}$) used for the part B are allocated in frames 13, 21, 29, and 5. Also, when the input data rate is 8 (X=4), time periods (PartBtime$_{Fil4}$) used for the part B are allocated in frames 15, 19, 23, 27, 31, 3, 7, and 11. Also, when the input data rate is 16 (X=5), time periods (PartBtime$_{Fil5}$) used for the part B are allocated in frames 16, 18, 20, 22, 24, 26, 28, 30, 0, 2, 4, 6, 8, 10, 12, and 14.

Re-referring to FIG. 9, the first delaying part 410 may delay the input values IN, PartA (that is, outputs of the first calculating part 400), and PartB (that is, outputs of the second calculating part 500) based on the enable signals (EN_Div2_PartA, EN_Div4_PartA, EN_Div8_PartA, EN_DIV16_PartA, EN_DIV32_PartA) generated in the enable signal generating part 200. The first delaying part 410 may include a first delaying block 420 (shift register A0), a second delaying block 430-1 (shift register A1), a third delaying block 430-2 (shift register A2), . . . , and a (n/2)$^{th}$ delaying block 430-(n/2) (shift register A(num_coeff/2)). The first delaying block 420, the second delaying block 430-1, the third delaying block 430-2, . . . , and the (n/2)$^{th}$ delaying block 430-(n/2) may be connected in a cascade structure. Here, 'num_coeff' may mean the number of coefficients of the interpolation filter.

Each of the above delaying blocks may delay one of the input values and output it based on the time assignment algorithm. That is, the first delaying part 410 may configure an output calculation period (that is, a block calculation period described in the explanation for the above time assignment algorithm) for each of the delaying blocks based on the number of the delaying blocks, delay one of the input values in the configured output calculation period, and output it.

Figure 11:
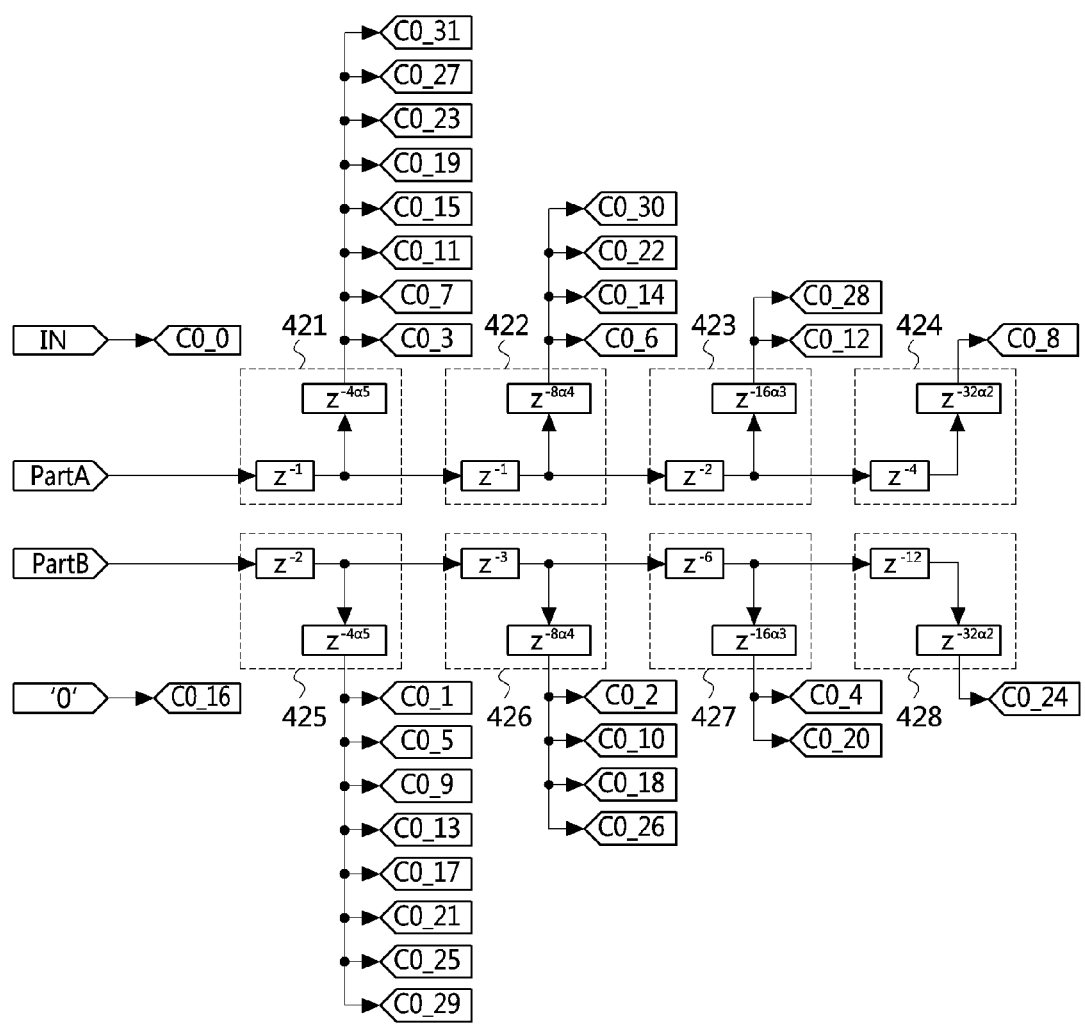
FIG. 11 is a block diagram illustrating a first delaying block included in a first calculating part of an interpolation filter.

FIG. 11 is a block diagram illustrating a first delaying block included in a first calculating part of an interpolation filter.

Referring to FIG. 11, the first delaying block 420 may include a plurality of delaying units 421 to 428. The plurality of delaying units 421 to 428 may delay input values (IN, PartA (that is, outputs of the first calculating part 400), PartB (that is, outputs of the second calculating part 500), a constant value 0) and output them. That is, the plurality of delaying units 421 to 428 may delay the input values (IN, PartA, PartB, a constant value 0), generate output values (C0_0~C0_31), and provide the output values (C0_0~C0_31) to the muxing part 440. The output values outputted by the plurality of the delaying units 421 to 428 may be represented as the following equation 3.

$$PartASelIn * z^{-(i_{PartAdelay}+2^{N-x+2} \cdot ax)} = C0\_i0$$

$$x=2\sim N, ax \geq 0,$$

$$i0 = PartAtime_{Filx}$$

$$(i_{Filx}=\text{even\_number}) \Rightarrow PartASelIn = PartA, i_{PartAdelay} = 2^{(N-x)}$$

$$(i_{Filx}=\text{odd\_number}) \Rightarrow PartASelIn = PartB, i_{PartAdelay} = 2^{(N-x)}-1 \quad \text{[Equation 3]}$$

Figure 12:
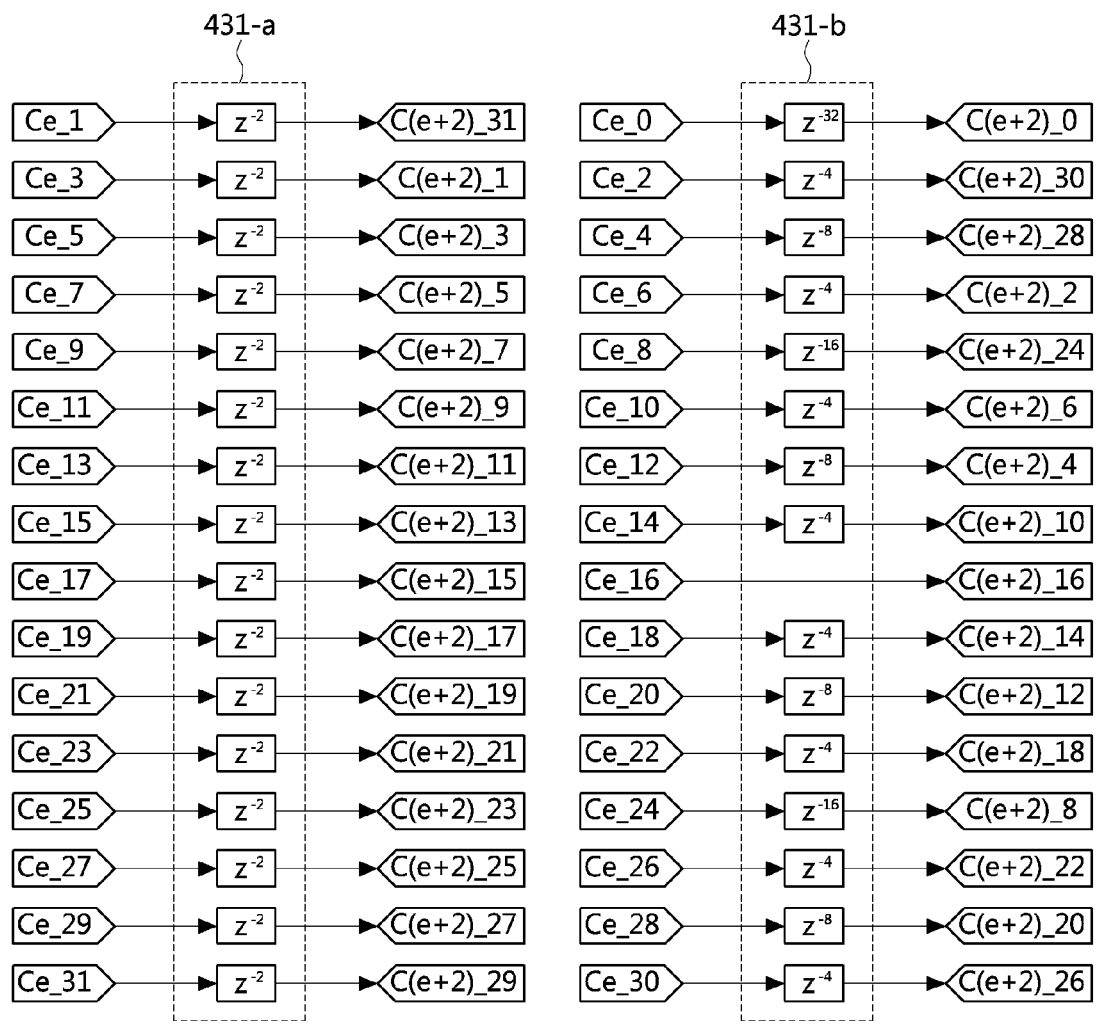
FIG. 12 is a block diagram illustrating a second delaying block included in a first calculating part of an interpolation filter.

FIG. 12 is a block diagram illustrating a second delaying block included in a first calculating part of an interpolation filter.

Referring to FIG. 12, a second delaying block 430-1, a third delaying block 430-2, . . . , a (n/2)$^{th}$ delaying block 430-(n/2) may have identical structure. The second delaying block 430-1 may include a plurality of delaying units 431-a and 431-b. The plurality of delaying units 431-a and 431-b may delay input values C0_0~C0_31 (that is, $2^N$ output values of the first delaying block) and Ce_0~Ce_31 (that is, output values of the second delaying block; e is 0 or an even number over 0), and output them. That is, the plurality of delaying units 431-a and 431-b may delay the input values (C0_0~C0_31, Ce_0~Ce_31), generate output values (C(e+2)_0~C(e+2)_31), and provide the output values (C(e+2)_0~C(e+2)_31) to the muxing part 440. The output values outputted by the plurality of the delaying units 431-a and 431-b may be represented as the following equation 4.

$$Ce\_i1 * z^{-(N-x+1)} = C(e+2)\_i2$$

$$x = 1 \sim N$$

$$i1 = PartAtime_{Filx}$$

$$i2 = mod(i1 - 2^{(N-x+1)} + 32, 32) \quad \text{[Equation 4]}$$

The first muxing part 440 may select one of output values of the first delaying block 420, the second delaying block 430-1, the third delaying block 430-2, . . . , and the (n/2)$^{th}$ delaying block 430-(n/2) according to the corresponding operation period (that is, the corresponding output calculation period) and output the selected output value. The muxing part 440 may include a plurality of muxing blocks MUX0, MUX2, MUX4, . . . , and MUX(num_coeff-2). The muxing block MUX0 may select output value of the first delaying block 420 according to the corresponding operation period (that is, the corresponding output calculation period) and output the selected output value. The muxing block MUX2 may select output value of the second delaying block 430-1 according to the corresponding operation period (that is, the corresponding output calculation period) and output the selected output value. The muxing block MUX4 may select output value of the third delaying block 430-2 according to the corresponding operation period (that is, the corresponding output calculation period) and output the selected output value. The muxing block MUX(num_coeff-2) may select output value of the (n/2)$^{th}$ delaying block 430-(n/2) according to the corresponding operation period (that is, the corresponding output calculation period) and output the selected output value.

Figure 13:
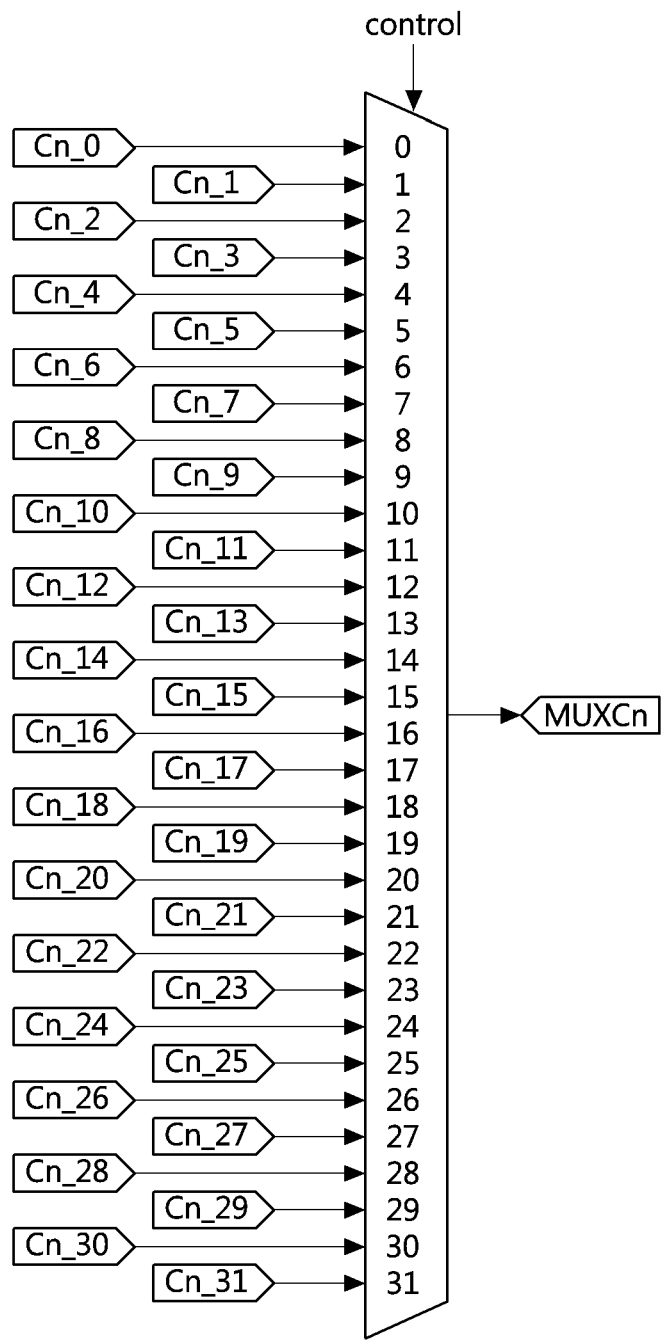
FIG. 13 is a block diagram illustrating a configuration of a muxing block included in an interpolation filter.

FIG. 13 is a block diagram illustrating a configuration of a muxing block included in an interpolation filter.

Referring to FIG. 13, each of muxing blocks MUX0, MUX2, MUX4, . . . , and MUX(num_coeff-2) may have identical structure. The muxing block may receive a muxing selection control signal 'CONTROL' as a first input value and receive the output values Cn_0~Cn_31 of the corresponding delaying block as a second input value. The muxing block may generate an output value for the input values based on the muxing selection control signal CONTROL.

Figure 14:
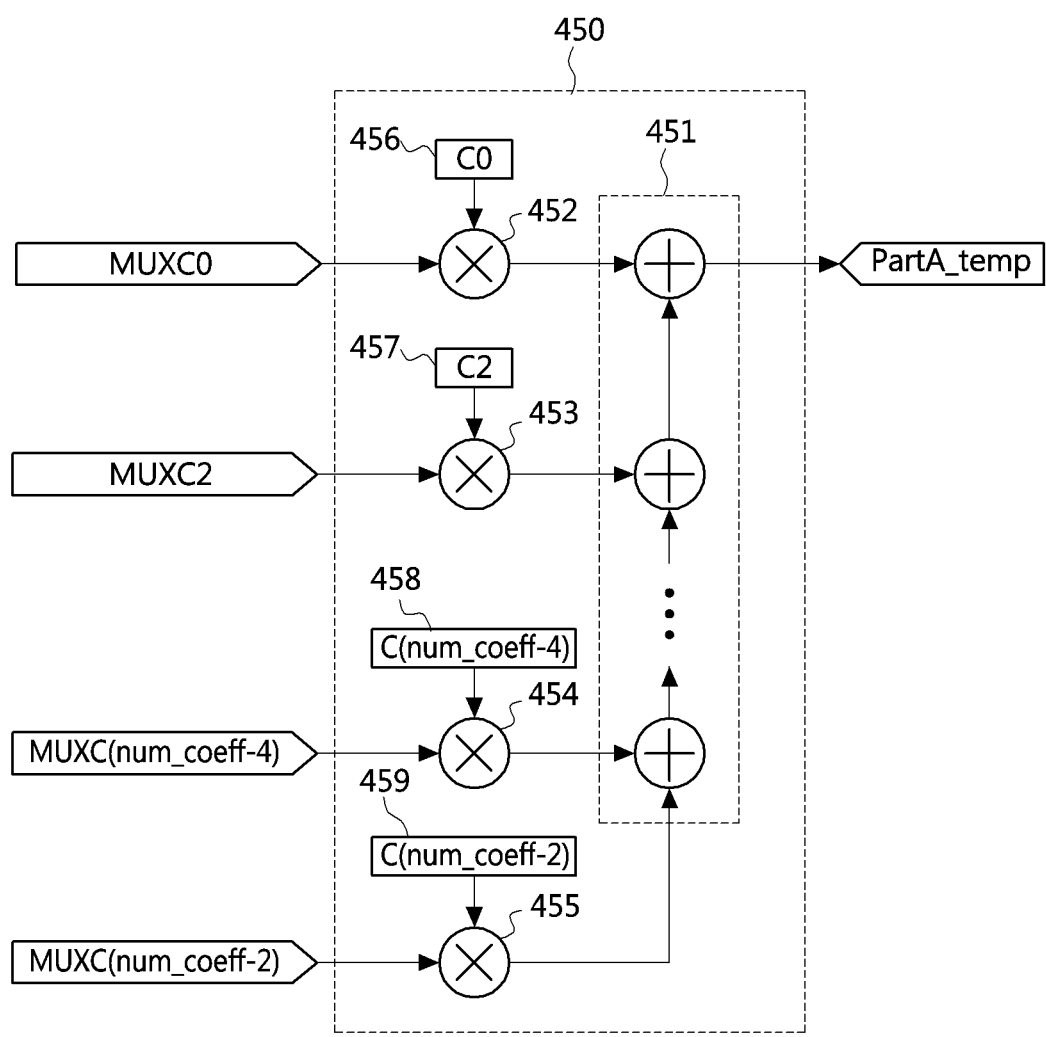
FIG. 14 is a block diagram illustrating a configuration of a first operating part included in a first calculating part of an interpolation filter.

FIG. 14 is a block diagram illustrating a configuration of a first operating part included in a first calculating part of an interpolation filter.

Referring to FIG. 14, the first operating part 450 may comprise a plurality of multipliers 452 to 455 and a plurality of adders 451. The number of the plurality of multipliers 452 to 455 is num_coeff/2, that is, the number of multipliers is the same with the number of delaying blocks. Each of the multipliers 452 to 455 may receive the output value of the muxing part 440 as a first input value and receive one of coefficients 456 to 459 (C0~C(num_coeff-2)) of the interpolation filter as a second input value. Each of the multipliers 452 to 455 may generate a first multiplication result by multiplying the first input value and the second input value. The number of the plurality of adders 451 is (num_coeff/2)-1, that is, the number of adders is one less than the number of delaying blocks. Also, the adders may add output values of the multipliers 452 to 455 and generate a first output candidate value PartA_temp.

Figure 15:
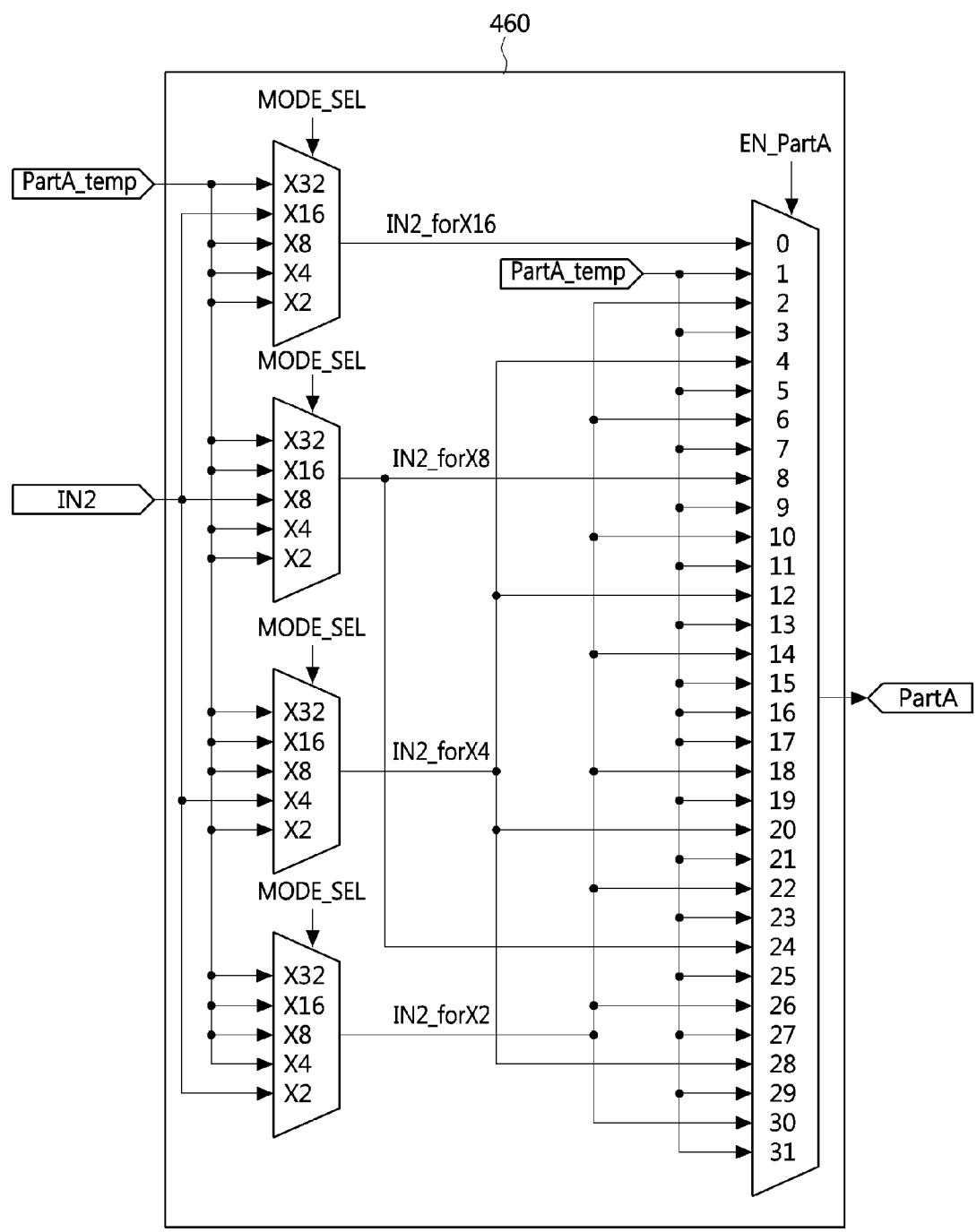
FIG. 15 is a block diagram illustrating a first selecting part included in a first calculating part of an interpolation filter.

FIG. 15 is a block diagram illustrating a first selecting part included in a first calculating part of an interpolation filter.

Referring to FIG. 15, the first selecting part 460 may receive the output value PartA_temp of the first calculating part 450 and the output value IN2 of the input value generating part 300 as input values, and generate an output value PartA in response to the input values PartA_temp and IN2 based on the first selection signal MODE_SEL and the second selection signal EN_PartA. Here, PartA is the first output value generated by the first calculating part 400.

Figure 16:
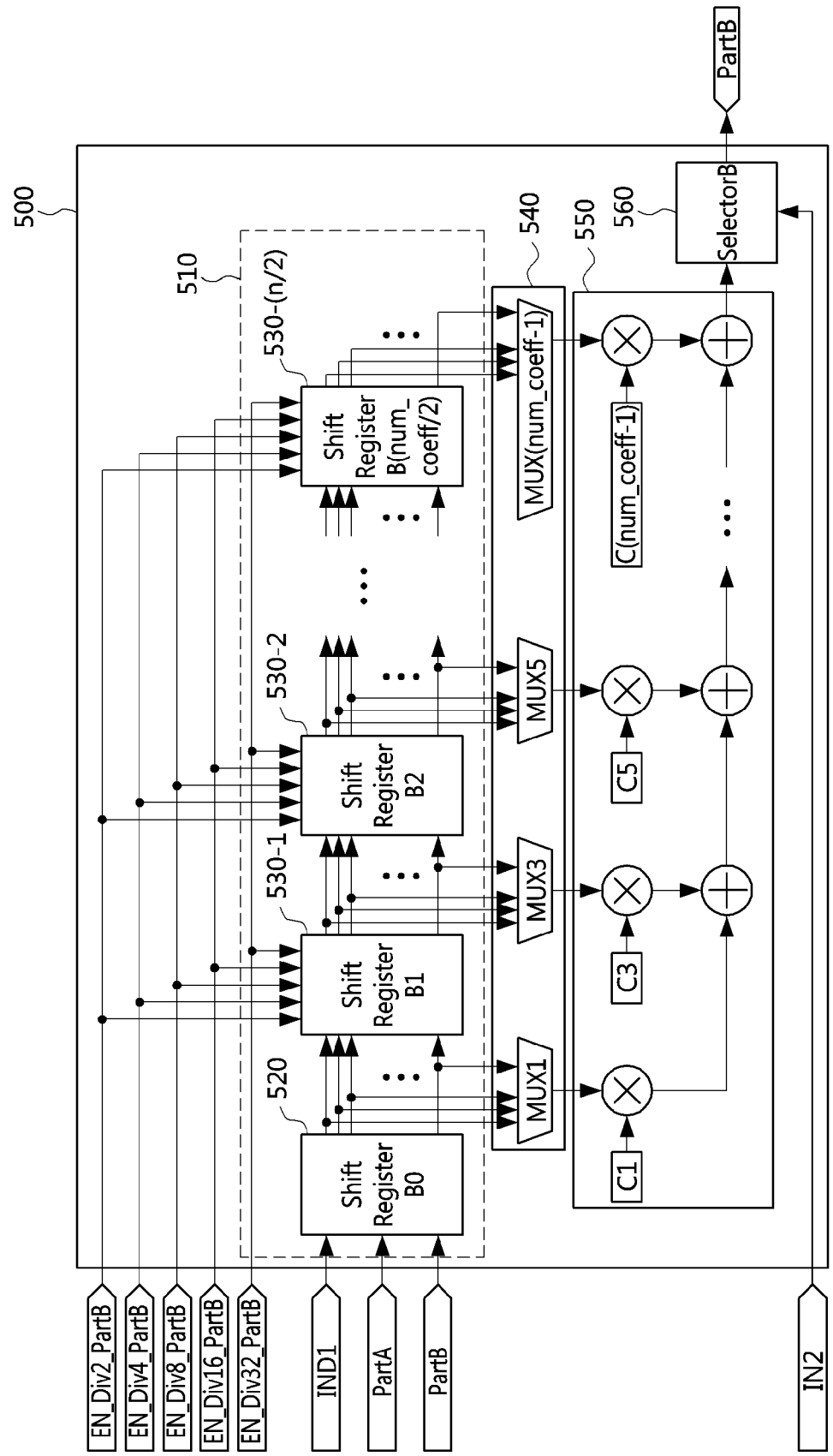
FIG. 16 is a block diagram illustrating a second calculating part included in an interpolation filter according to an example embodiment of the present invention.

FIG. 16 is a block diagram illustrating a second calculating part included in an interpolation filter according to an example embodiment of the present invention.

Referring to FIG. 16, the second calculating part 500 may comprise a second delaying part 510, a second muxing part 540, a second operating part 550, and a second selecting part 560. The second delaying part 510 may generate a delay value for one of the second input values based on the second enable signal. The second muxing part 540 may select and output a delay value for the second input value based on a configured output calculation period. The second operating part 550 may generate second multiplication results for the outputs of the second muxing part 540 and second coefficient values, and generate a second output candidate value by summing the second multiplication results. Here, the second coefficient values mean odd-numbered coefficients (C1, C3, . . . , (C(num_coeff-1)) among coefficients of the interpolation filter. The second selecting part 560 may select one of the second input values or the second output candidate value as a second output value based on the interpolation filter operation mode. Here, the second calculating part 560 may generate the second output value based on the time assignment algorithm.

The second delaying part 510 may delay the input values IND1, PartA (that is, outputs of the first calculating part 400), and PartB (that is, outputs of the second calculating part 500) based on the enable signals (EN_Div2_PartB, EN_Div4_PartB, EN_Div8_PartB, EN_DIV16_PartB, EN_DIV32_PartB) generated in the enable signal generating part 200. The second delaying part 510 may include a first delaying block 520 (shift register B0), a second delaying block 530-1 (shift register B1), a third delaying block 530-2 (shift register B2), . . . , and a (n/2)$^{th}$ delaying block 530-(n/2) (shift register B(num_coeff/2)). The first delaying block 520, the second delaying block 530-1, the third delaying block 530-2, . . . , and the (n/2)$^{th}$ delaying block 530-(n/2) may be connected in a cascade structure. Here, num_coeff may mean the number of coefficients of the interpolation filter.

Each of the above delaying blocks may delay one of the input values and output it based on the time assignment algorithm. That is, the second delaying part 510 may configure an output calculation period (that is, a block calculation period described in the explanation for the above time assignment algorithm) for each of the delaying blocks based on the number of the delaying blocks, delay one of the input values in the configured output calculation period, and output it.

Figure 17:
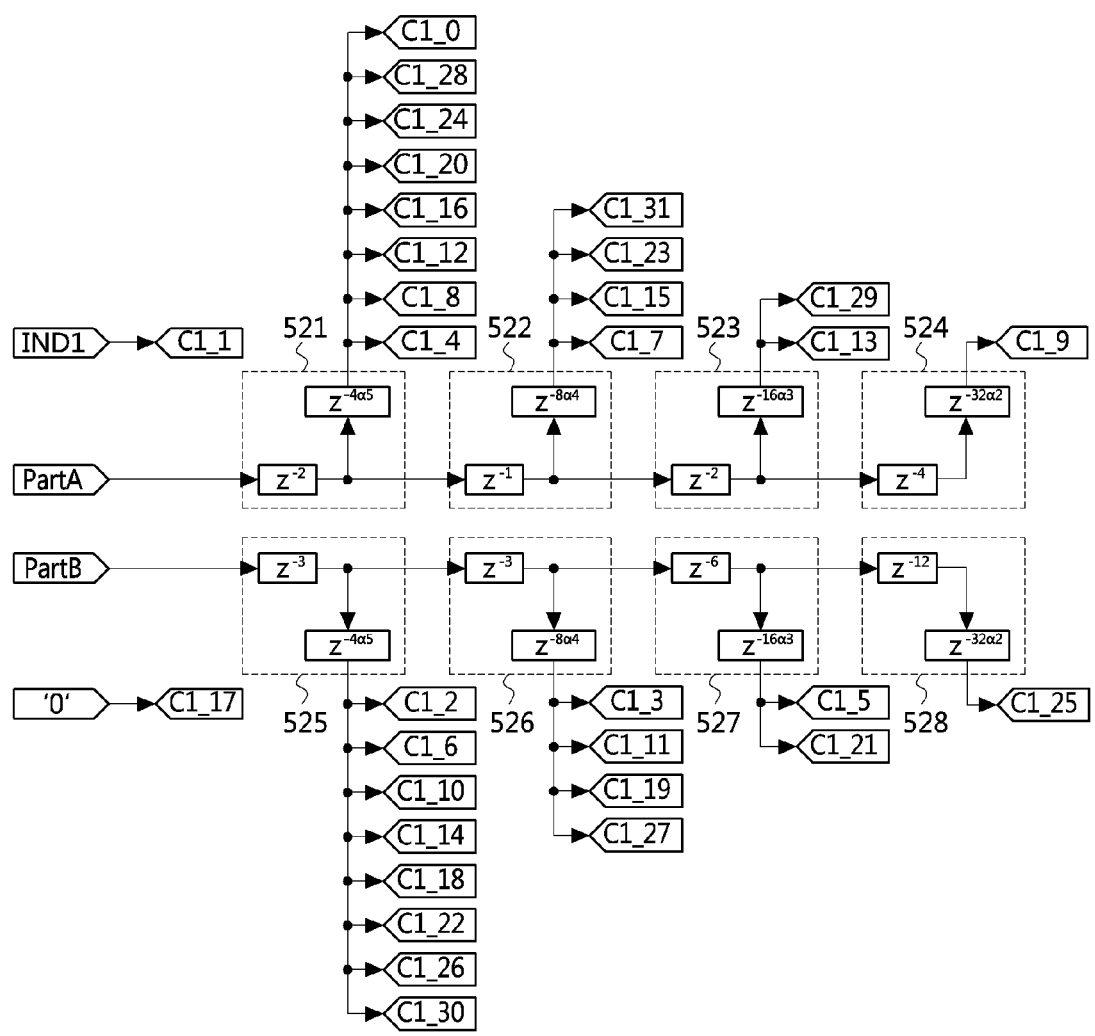
FIG. 17 is a block diagram illustrating a first delaying block included in a second calculating part of an interpolation filter.

FIG. 17 is a block diagram illustrating a first delaying block included in a second calculating part of an interpolation filter.

Referring to FIG. 17, the first delaying block 520 may include a plurality of delaying units 521 to 528. The plurality of delaying units 521 to 528 may delay input values (IND1, PartA (that is, outputs of the first calculating part 400), PartB (that is, outputs of the second calculating part 500), a constant value 0) and output them. That is, the plurality of delaying units 521 to 528 may delay the input values (IND1, PartA, PartB, a constant value 0), generate output values (C1_0~C1_31), and provide the output values (C1_0~C1_31) to the muxing part 540. The output values outputted by the plurality of the delaying units 521 to 528 may be represented as the following equation 5.

$$PartBSelIn * z^{-(jPartBdelay+2^{N-x+2} \cdot ax)} = C1\_j0$$

$$x=2-N, ax \geq 0,$$

$$j0 = PartBtime_{Filx}$$

$$(i_{Filx} = \text{even\_number}) \Rightarrow PartBSelIn = PartA, j_{PartB\ delay} = 2^{(N-x)} + 1$$

$$(i_{Filx} = \text{odd\_number}) \Rightarrow PartBSelIn = PartB, j_{PartB\ delay} = 3 * 2^{(N-x)} \quad \text{[Equation 5]}$$

Figure 18:
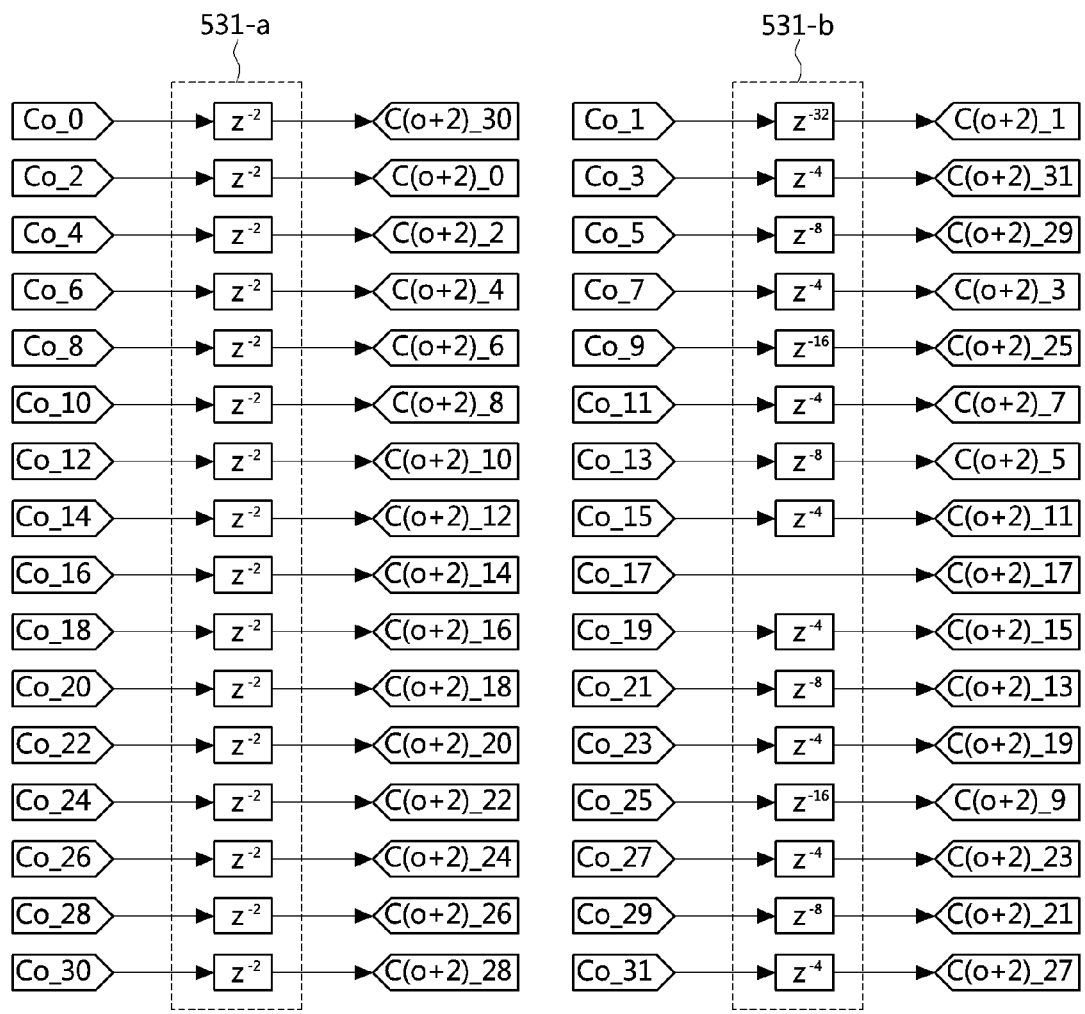
FIG. 18 is a block diagram illustrating a second delaying block included in a second calculating part of an interpolation filter.

FIG. 18 is a block diagram illustrating a second delaying block included in a second calculating part of an interpolation filter.

Referring to FIG. 18, a second delaying block 530-1, a third delaying block 530-2, ..., a $(n/2)^{th}$ delaying block 530-($n/2$), etc. may have identical structure. The second delaying block 530-1 may include a plurality of delaying units 531-$a$ and 531-$b$. The plurality of delaying units 531-$a$ and 531-$b$ may delay input values C1_0~C1_31 (that is, $2^N$ output values of the first delaying block) and Co_0~Co_31 (that is, output values of the second delaying block; o is 0 or an odd number over 0), and output them. That is, the plurality of delaying units 531-$a$ and 531-$b$ may delay the input values (C1_0~C1_31, Co_0~Co_31), generate output values (C(o+2)_0~C(o+2)_31), and provide the output values (C(o+2)_0~C(o+2)_31) to the muxing part 540. The output values outputted by the plurality of the delaying units 531-$a$ and 531-$b$ may be represented as the following equation 6.

$$Co\_j1 * z^{-(N-x+1)} = C(o+2)\_j2$$

$$x = 1 \sim N$$

$$j1 = PartBtime_{Filx}$$

$$j2 = \text{mod}(i1 - 2^{(N-x+1)} + 32, 32) \quad \text{[Equation 6]}$$

The second muxing part 540 may select one of output values of the first delaying block 520, the second delaying block 530-1, the third delaying block 530-2, ..., and the $(n/2)^{th}$ delaying block 530-($n/2$) according to the corresponding operation period (that is, the corresponding output calculation period) and output the selected output value. The second muxing part 540 may include a plurality of muxing blocks MUX1, MUX3, MUX5, ..., and MUX(num_coeff−1). The muxing block MUX1 may select output value of the first delaying block 520 according to the corresponding operation period (that is, the corresponding output calculation period) and output the selected output value. The muxing block MUX3 may select output value of the second delaying block 530-1 according to the corresponding operation period (that is, the corresponding output calculation period) and output the selected output value. The muxing block MUX5 may select output value of the third delaying block 530-2 according to the corresponding operation period (that is, the corresponding output calculation period) and output the selected output value. The muxing block MUX (num_coeff−1) may select output value of the $(n/2)^{th}$ delaying block 530-($n/2$) according to the corresponding operation period (that is, the corresponding output calculation period) and output the selected output value.

Re-referring to FIG. 13, each of muxing blocks MUX1, MUX3, MUX5, ..., and MUX(num_coeff−1) may have identical structure. The muxing block may receive a muxing selection control signal 'CONTROL' as a first input value and receive the output values Cn_0~Cn_31 of the corresponding delaying block as a second input value. The muxing block may generate an output value MUXCn for the input values based on the muxing selection control signal CONTROL.

Figure 19:
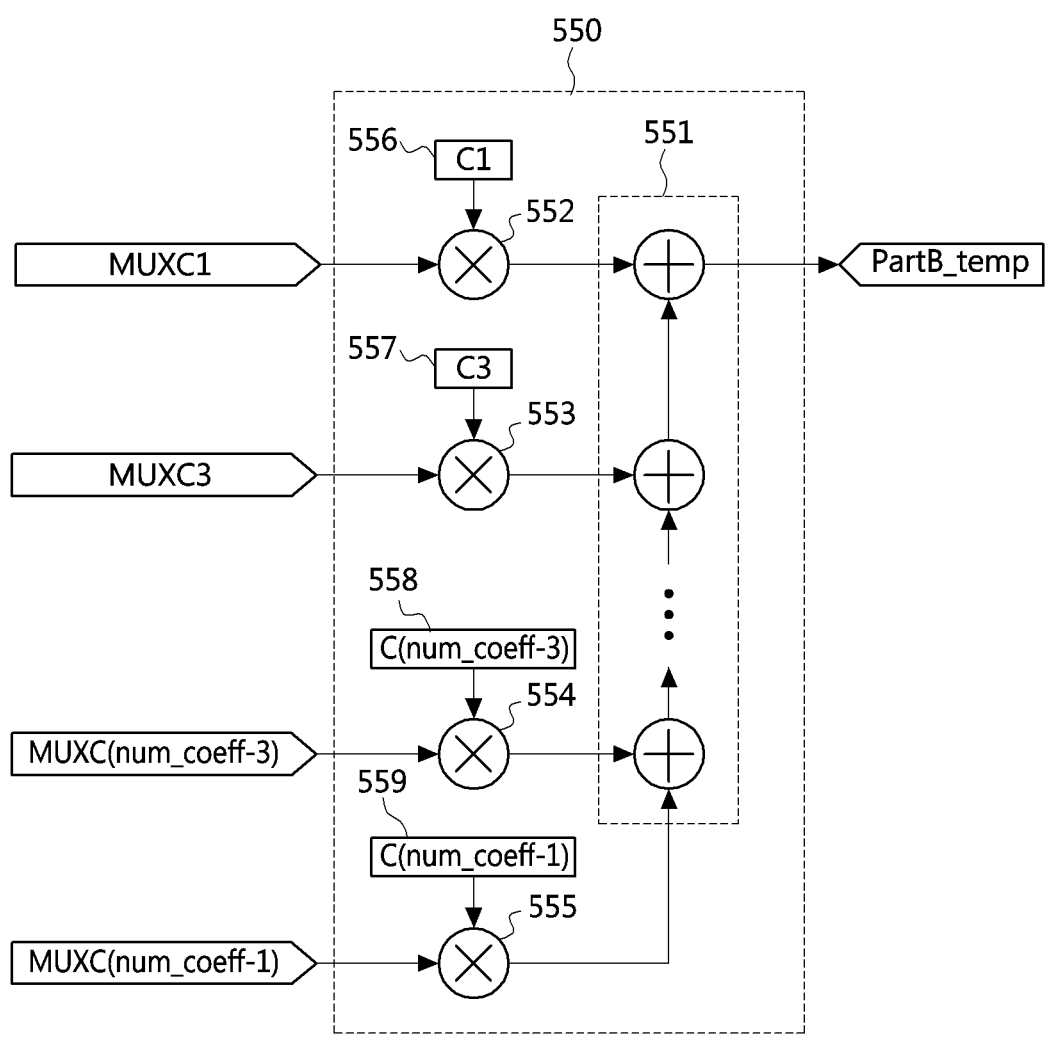
FIG. 19 is a block diagram illustrating a configuration of a second operating part included in a second calculating part of an interpolation filter.

FIG. 19 is a block diagram illustrating a configuration of a second operating part included in a second calculating part of an interpolation filter.

Referring to FIG. 19, the second operating part 550 may comprise a plurality of multipliers 552 to 555 and a plurality of adders 551. The number of the plurality of multipliers 552 to 555 is num_coeff/2, that is, the number of multipliers is the same with the number of delaying blocks. Each of the multipliers 552 to 555 may receive the output value of the muxing part 540 as a first input value and receive coefficients 556 to 559 (C1~C(num_coeff−1)) of the interpolation filter as a second input value. Each of the multipliers 552 to 555 may generate a second multiplication result by multiplying the first input value and the second input value. The number of the plurality of adders 551 is (num_coeff/2)−1, that is, the number of adders is one less than the number of delaying blocks). Also, the adders may add output values of the multipliers 552 to 555 and generate a second output candidate value PartB_temp.

Figure 20:
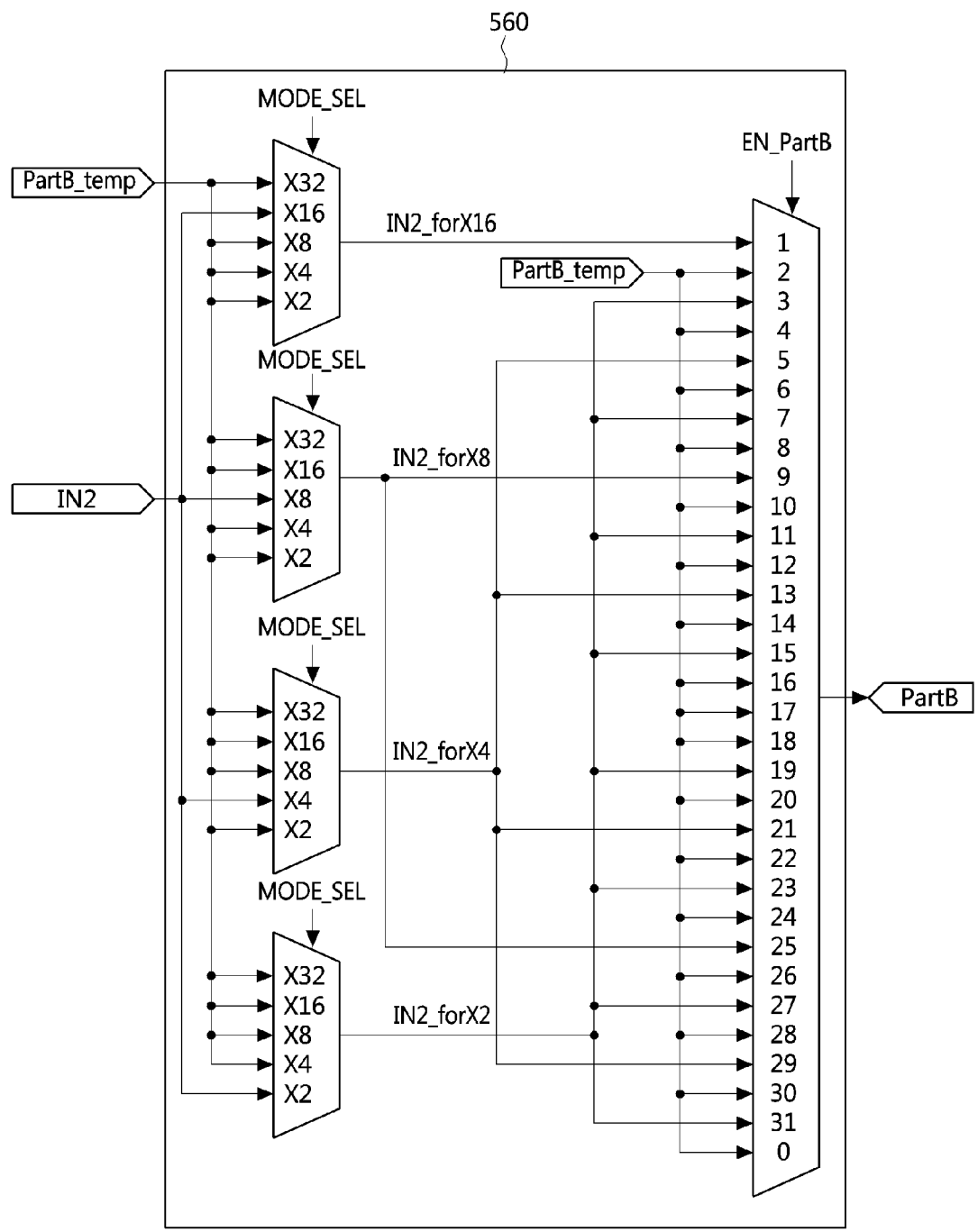
FIG. 20 is a block diagram illustrating a second selecting part included in a second calculating part of an interpolation filter.

FIG. 20 is a block diagram illustrating a second selecting part included in a second calculating part of an interpolation filter.

Referring to FIG. 20, the second selecting part 560 may receive the output value PartB_temp of the second calculating part 550 and the output value IN2 of the input value generating part 300 as input values, and generate output value PartB for the input values PartB_temp and IN2 based on the first selection signal MODE_SEL and the second selection signal EN_PartB. Here, PartB is the second output value generated by the second calculating part 500.

Re-referring to FIG. 3, the output selecting part 600 may delay the second output value by a preconfigured value, select one of the first output value PartA and the second output value PartB, which is delayed by the preconfigured value, based on an a control signal, and output the selected output value.

Figure 21:
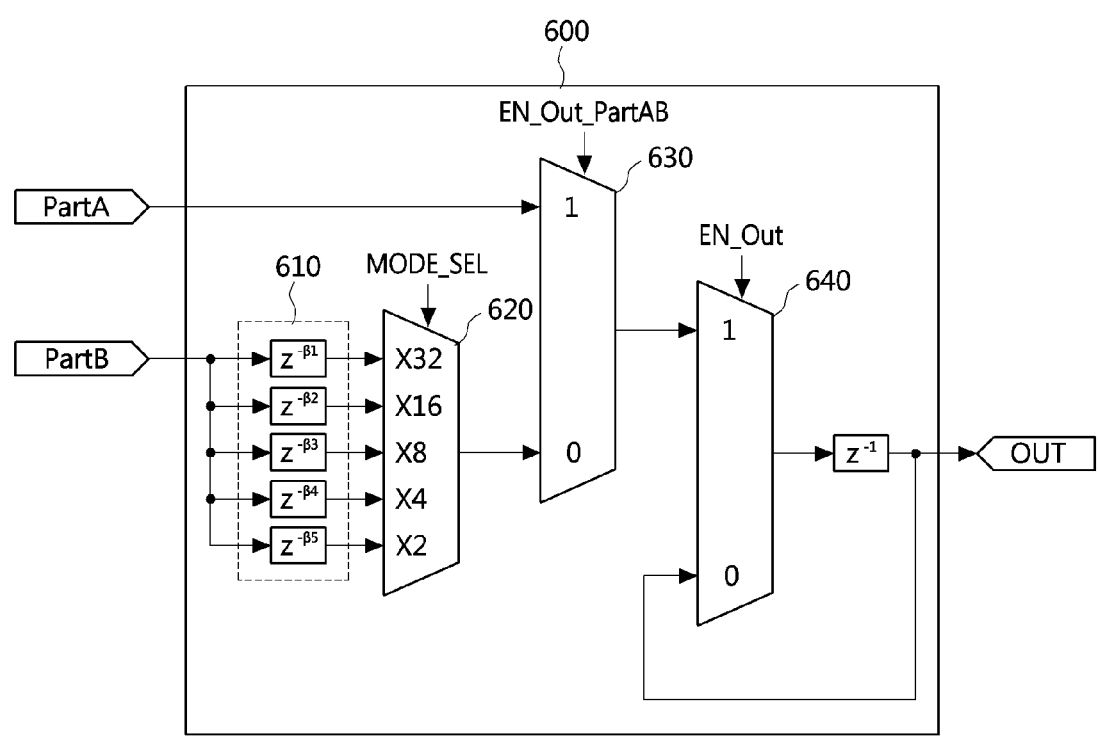
FIG. 21 is a block diagram illustrating a configuration of an output selecting part included in an interpolation filter.

FIG. 21 is a block diagram illustrating a configuration of an output selecting part included in an interpolation filter.

Referring to FIG. 21, the output selecting part 600 may select the first output value PartA or the second output value PartB based on control signals MODE_SEL, EN_Out_PartAB, and EN_Out, and output the selected one. The output selecting part 600 may comprise a delaying unit 610, a first muxing block 620, a second muxing block 630, and a third muxing block 640. The delaying unit 610 may delay the second output value PartB (β1, β2, β3, β4, β5≥0). The first muxing block 620 may select the delayed second output value PartB based on the control signal MODE_SEL and output the delayed second output value. The second muxing block 630 may select the first output value PartA or the output value of the first muxing block 620 based on the control signal EN_Out_PartAB and output the selected one. The third muxing block 640 may select the output value of the second muxing block 630 or the third muxing block 640 based on the control signal EN_Out and output the selected one. Here, an 'OUT' means a final output of the interpolation filter 100.

Figure 22:
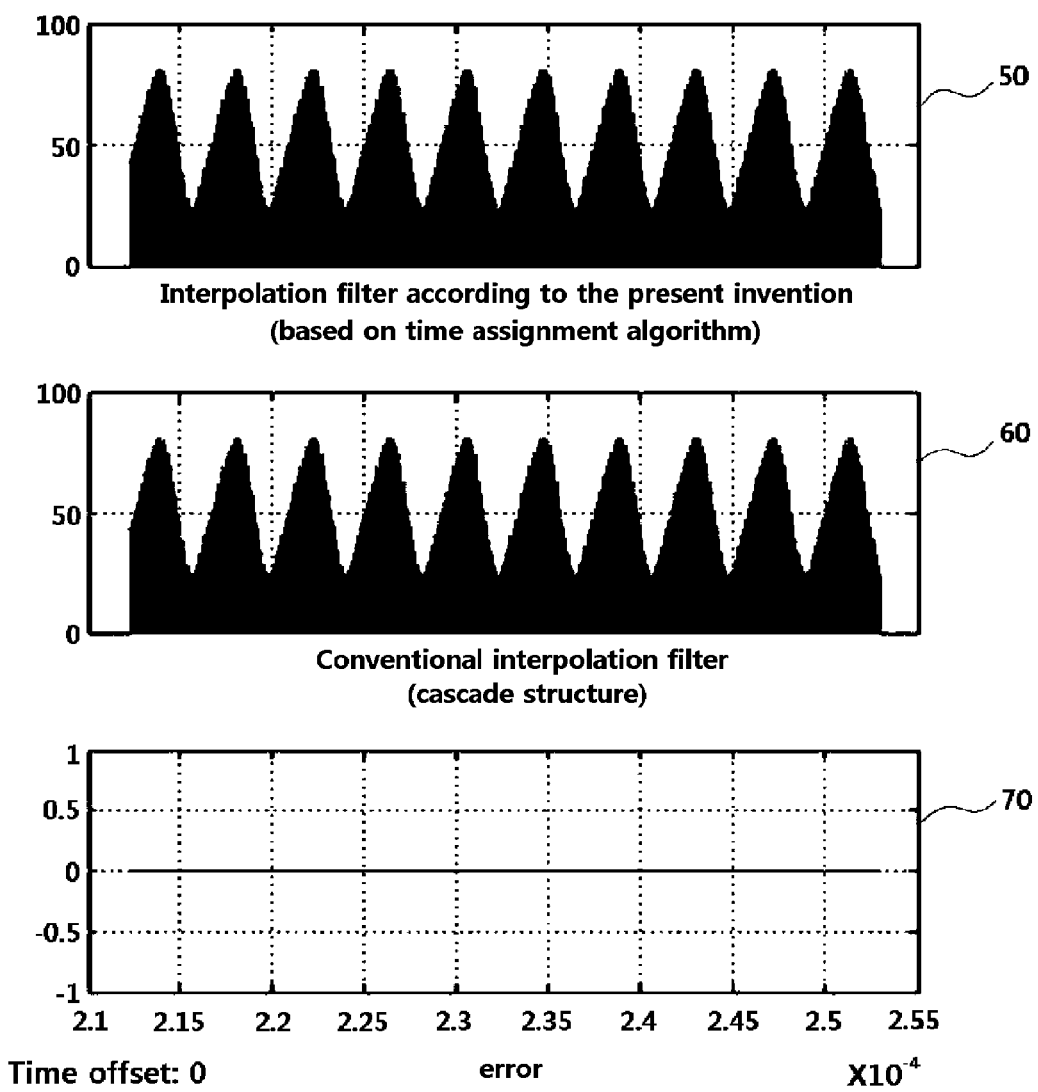
FIG. 22 is a graph illustrating a performance of an interpolation filter according to an example embodiment of the present invention.

FIG. 22 is a graph illustrating a performance of an interpolation filter according to an example embodiment of the present invention.

Referring to FIG. 22, a first graph 50 represent a final output of an interpolation filter according to an example embodiment of the present invention (that is, a filter to which time assignment algorithm is applied), a second graph 60 represents a final output of an interpolation filter of a cascade structure, and the a third graph 70 represents differences between values of the first graph 50 and the second graph 60.

It can be identified that the differences between the final output values of the interpolation filter according to the present invention and the final output values according to the conventional interpolation filter are 0. Therefore, although the number of multipliers decreases, the interpolation filter according to the present invention can work as suitable for the original purpose.

Base stations or terminals constituting a mobile communication system may include an interpolation filter according to an example embodiment of the present invention.

The term "terminal" used in this specification may be referred to as User Equipment (UE), a User Terminal (UT), a wireless terminal, an Access Terminal (AT), a Subscriber Unit (SU), a Subscriber Station (SS), a wireless device, a wireless communication device, a Wireless Transmit/Receive Unit (WTRU), a mobile node, a mobile, or other words. The terminal may be a cellular phone, a smart phone having a wireless communication function, a Personal Digital Assistant (PDA) having a wireless communication function, a wireless modem, a portable computer having a wireless communication function, a photographing device such as a digital camera having a wireless communication function, a gaming device having a wireless communication function, a music storing and playing appliance having a wireless communication function, an Internet home appliance capable of wireless Internet access and browsing, or also a portable unit or terminal having a combination of such functions. However, the terminal is not limited to the above-mentioned units.

Also, the term "base station" used in this specification means a fixed or mobile point to that communicates with terminals, and may be referred to as another word, such as Node-B, eNode-B, a base transceiver system (BTS), an access point, a radio access station, a Mobile Multihop Relay BS (MMR-BS), etc. Also, the term "base station" means a controlling apparatus which controls at least one cell. In a real wireless communication system, a base station may be connected to and controls a plurality of cells physically, in this case, the base station may be regarded to comprise a plurality of logical base stations. That is, parameters configured to each cell are assigned by the corresponding base station.

According to the present invention, continuity of output data of an interpolation filter can be guaranteed by using time assignment algorithm. In addition, since a single multiplier is shared by using time assignment algorithm, a total size of the interpolation filter can be reduced.

While the example embodiments of the present invention and their advantages have been described in detail, it should be understood that various changes, substitutions and alterations may be made herein without departing from the scope of the invention.

What is claimed is:

1. An interpolation filter comprising:
   an enable signal generating part generating enable signals for operations of the interpolation filter based on a demanded sampling rate;
   an input value generating part generating input values from input data;
   a first calculating part generating a first output value having the demanded sampling rate based on a first enable signal among the enable signals and first input values among the input values for a first calculation period;
   a second calculating part generating a second output value having the demanded sampling rate based on a second enable signal among the enable signals and second input values among the input values for a second calculation period; and
   an output value selecting part selecting a final output value among the first output value and the second output value based on preconfigured selection criteria,
   wherein the first calculation period and the second calculation period are determined according to a rate of the input data.

2. The filter of claim 1, wherein the enable signal generating part generates the enable signals by dividing a clock signal used in the interpolation filter by a predetermined value.

3. The filter of claim 2, wherein the enable signal generating part generates an enable signal for the input value generating part, an enable signal for the first calculating part, an enable signal for the second calculating part, and an enable signal for the output value selecting part by dividing the clock signal by 2 to $2^N$ (N is a positive integer).

4. The filter of claim 1, wherein the input value generating part generates the input values according to the rate of the input data based on time assignment algorithm.

5. The filter of claim 1, wherein the first calculation period corresponds to even-numbered coefficients of the interpolation filter among calculation periods.

6. The filter of claim 1, wherein the first calculating part comprises:
   a first delaying part delaying one of the first input values based on the first enable signal;
   a first muxing part selecting the delayed one of the first input values based on the first calculation period, and outputting the delayed one of the first input values;
   a first operating part generating a first output candidate value by generating first multiplication results for the outputs of the first muxing part and first coefficients of the interpolation filter and adding the first multiplication results; and
   a first selecting part selecting one of the first input values or the first output candidate value as the first output value based on an operation mode of the interpolation filter.

7. The filter of claim 6, wherein the first delaying part includes a plurality of delaying blocks connected in a cascade structure, and each of the plurality of delaying blocks delays one of the first input values and outputs the delayed one of the first input values based on a predefined time assignment algorithm.

8. The filter of claim 6, wherein the first delaying part configures the first calculation period for each of the plurality of delaying blocks based on the number of the plurality of delaying blocks, delays one of the first input values, and outputs the delayed one of the first input values in the configured first calculation period.

9. The filter of claim 6, wherein the first calculating part includes a plurality of multipliers and a plurality of adders, and the number of the plurality of multipliers is identical to the number of the delaying blocks, and the number of the plurality of adders is one less than the number of the plurality of multipliers.

10. The filter of claim 1, wherein the second calculation period corresponds to odd-numbered coefficients of the interpolation filter among calculation periods.

11. The filter of claim 1, wherein the second calculating part comprises:
a second delaying part delaying one of the second input values based on the second enable signal;
a second muxing part selecting the delayed one of the second input values based on the second calculation period, and outputting the delayed one of the second input values;
a second operating part generating a second output candidate value by generating second multiplication results for the outputs of the second muxing part and second coefficients of the interpolation filter and adding the second multiplication results; and
a second selecting part selecting one of the second input values or the second output candidate value as the second output value based on an operation mode of the interpolation filter.

12. The filter of claim 11, wherein the second delaying part includes a plurality of delaying blocks connected in a cascade structure, and each of the plurality of delaying blocks delays one of the second input values and outputs the delayed one of the second input values based on a predefined time assignment algorithm.

13. The filter of claim 11, wherein the second delaying part configures the second calculation period for each of the plurality of delaying blocks based on the number of the plurality of delaying blocks, delays one of the input values, and outputs the delayed one of the second input values in the configured second calculation period.

14. The filter of claim 11, wherein the second calculating part includes a plurality of multipliers and a plurality of adders, and the number of the plurality of multipliers is identical to the number of the delaying blocks, and the number of the plurality of adders is one less than the number of the plurality of multipliers.

15. The filter of claim 1, wherein the output selecting part delays the second output value by a predetermined value, selects one of the first output value and the second output value which is delayed by the predetermined value based on a control signal, and outputs the selected value.

* * * * *